(12) United States Patent
Katine et al.

(10) Patent No.: US 9,941,331 B1
(45) Date of Patent: Apr. 10, 2018

(54) DEVICE WITH SUB-MINIMUM PITCH AND METHOD OF MAKING

(71) Applicant: SANDISK TECHNOLOGIES LLC, Plano, TX (US)

(72) Inventors: Jordan Asher Katine, Mountain View, CA (US); Christopher J. Petti, Mountain View, CA (US); Yangyin Chen, Heverlee (BE)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/414,961

(22) Filed: Jan. 25, 2017

(51) Int. Cl.
| | |
|---|---|
| *H01L 29/82* | (2006.01) |
| *H01L 27/22* | (2006.01) |
| *H01L 43/02* | (2006.01) |
| *H01L 43/08* | (2006.01) |
| *H01L 43/12* | (2006.01) |
| *G11C 11/16* | (2006.01) |

(52) U.S. Cl.
CPC ........ *H01L 27/226* (2013.01); *G11C 11/1655* (2013.01); *G11C 11/1657* (2013.01); *G11C 11/1673* (2013.01); *G11C 11/1675* (2013.01); *H01L 27/224* (2013.01); *H01L 43/02* (2013.01); *H01L 43/08* (2013.01); *H01L 43/12* (2013.01)

(58) Field of Classification Search
CPC ......... H01L 43/02; H01L 43/08; H01L 43/12; H01L 27/226; H01L 27/224; G11C 11/1655; G11C 11/1673; G11C 11/1657
USPC ......................................................... 257/421
See application file for complete search history.

(56) References Cited

U.S. PATENT DOCUMENTS

| | | | | |
|---|---|---|---|---|
| 7,977,661 B2 * | 7/2011 | Philipp | ............... | H01L 27/2436 257/2 |
| 8,587,042 B2 * | 11/2013 | Kajiyama | ........... | H01L 27/0207 257/295 |
| 8,866,244 B2 * | 10/2014 | Nitta | ....................... | G11C 11/14 257/295 |

* cited by examiner

*Primary Examiner* — Luan C Thai
(74) *Attorney, Agent, or Firm* — Vierra Magen Marcus LLP

(57) ABSTRACT

A method is provided that includes forming a first level above a substrate, forming a second level above the first level, and forming a third level above the second level. The first level includes a plurality of first elements having a first minimum pitch, the second level includes a plurality of second elements having a second minimum pitch greater than the first minimum pitch, and the third level includes a plurality of third elements having a third minimum pitch greater than the first minimum pitch. The second elements are disposed above and aligned with a first plurality of the first elements, and the third elements are disposed above and aligned with a second plurality of the first elements.

18 Claims, 49 Drawing Sheets

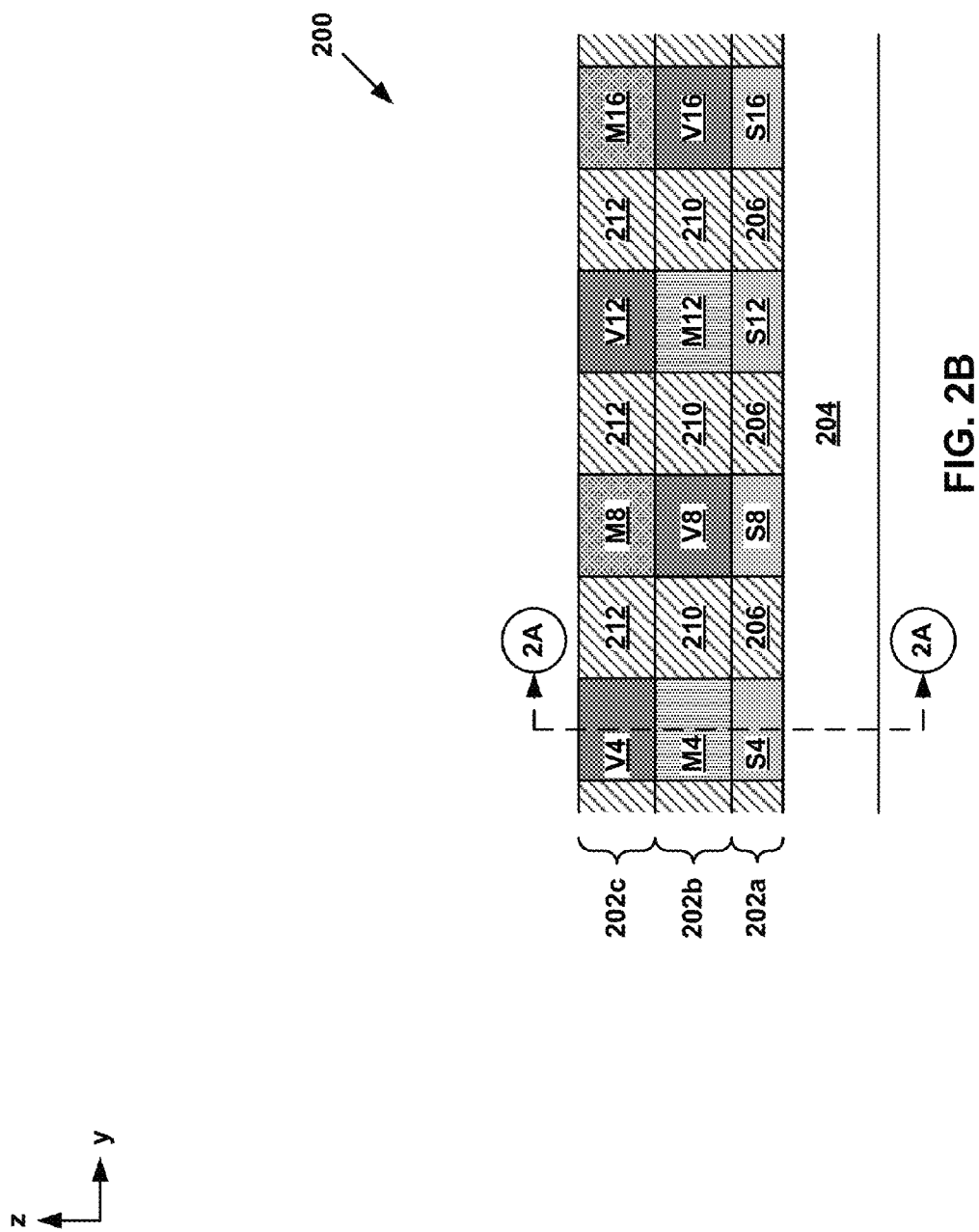

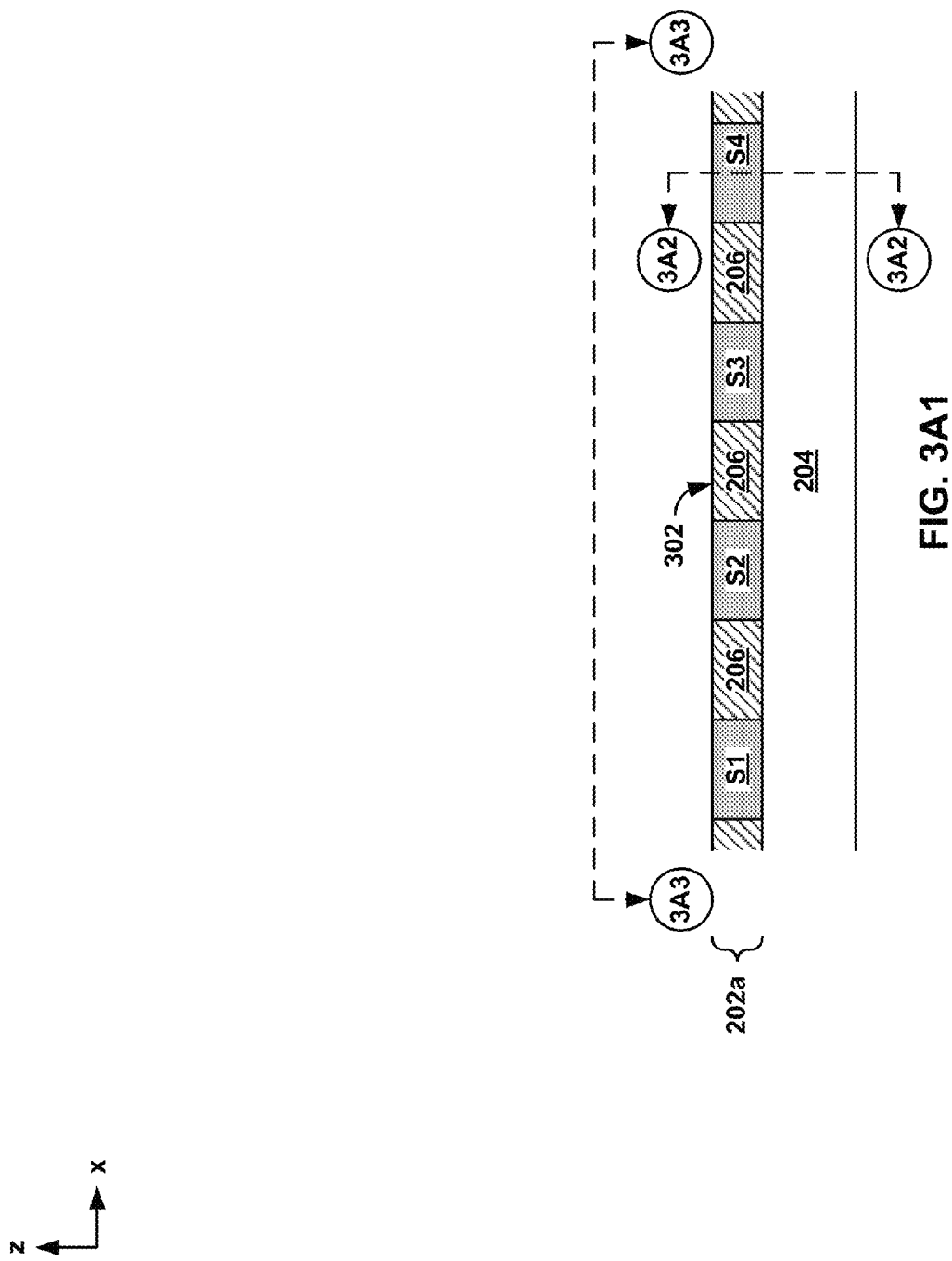
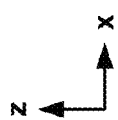
FIG. 3A1

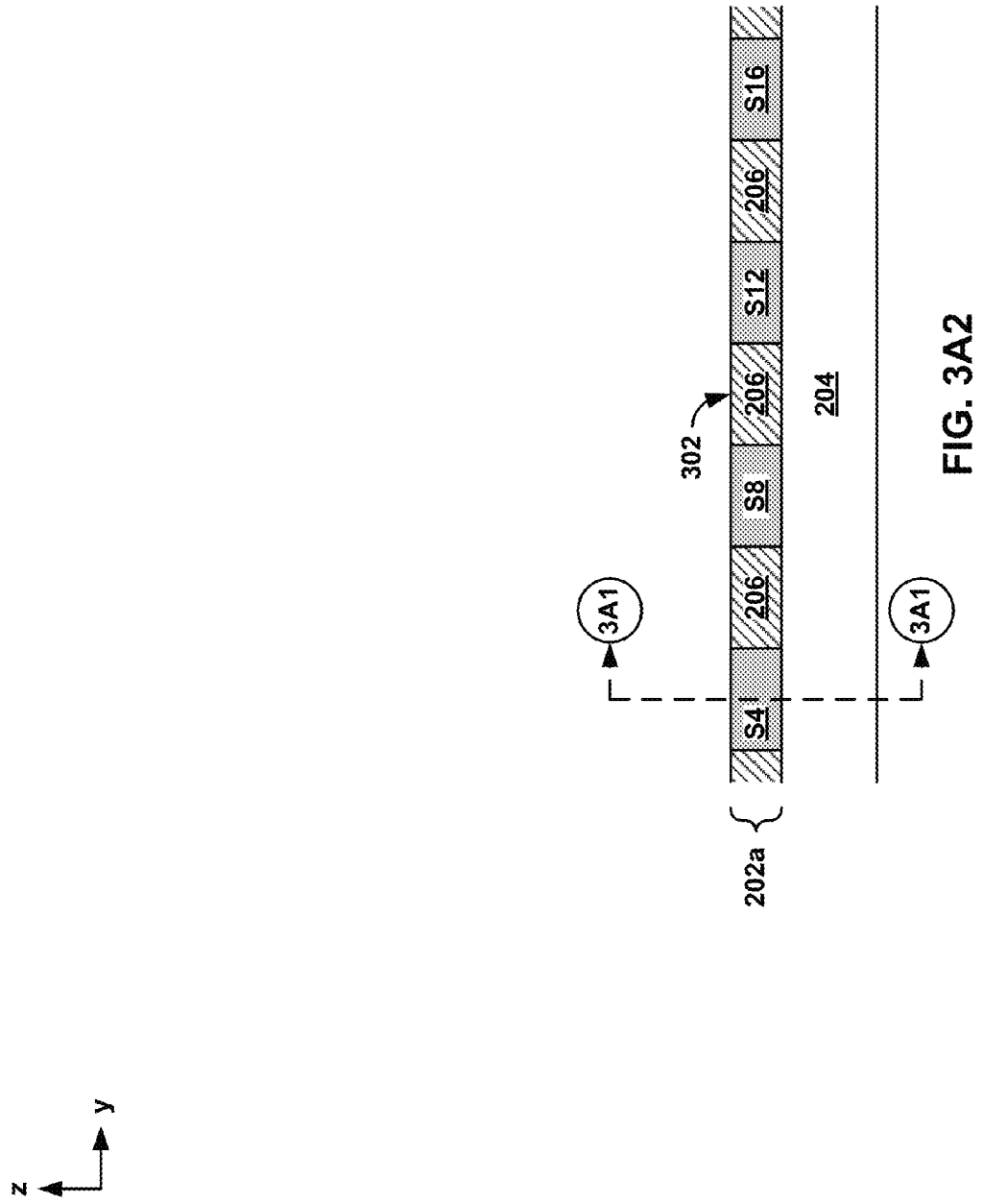

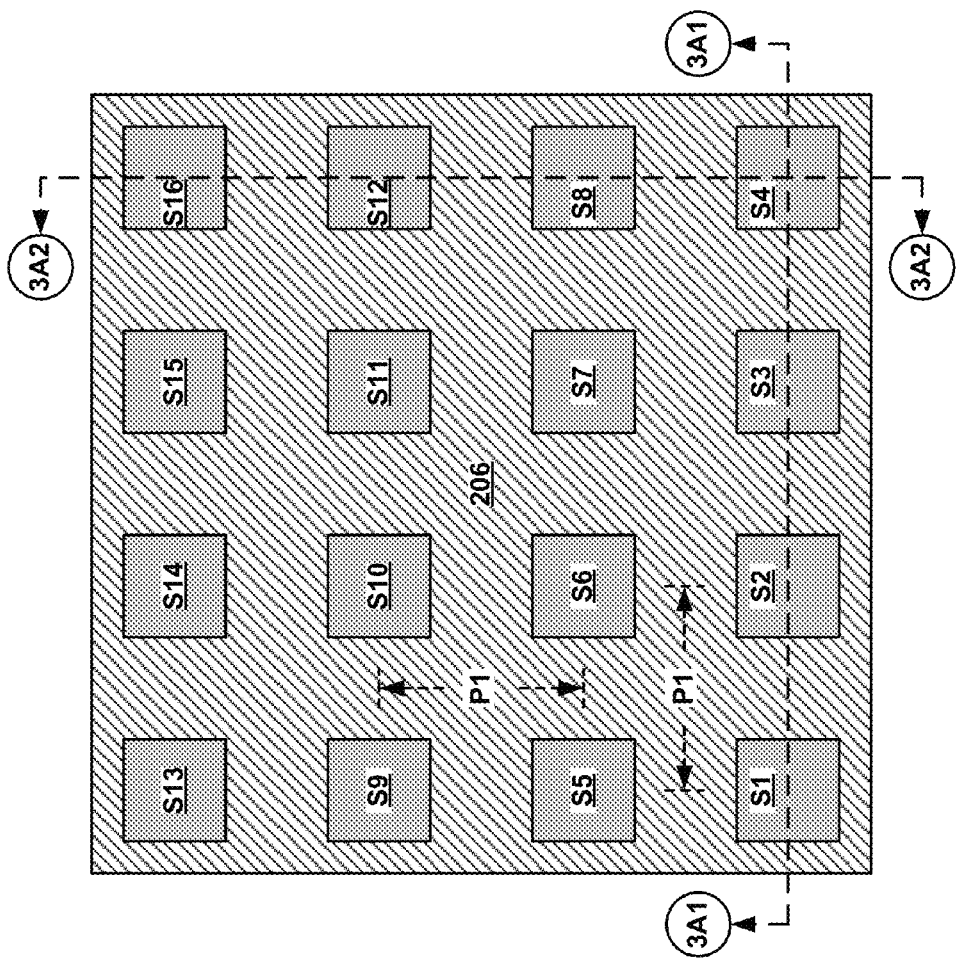
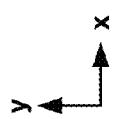
FIG. 3A3

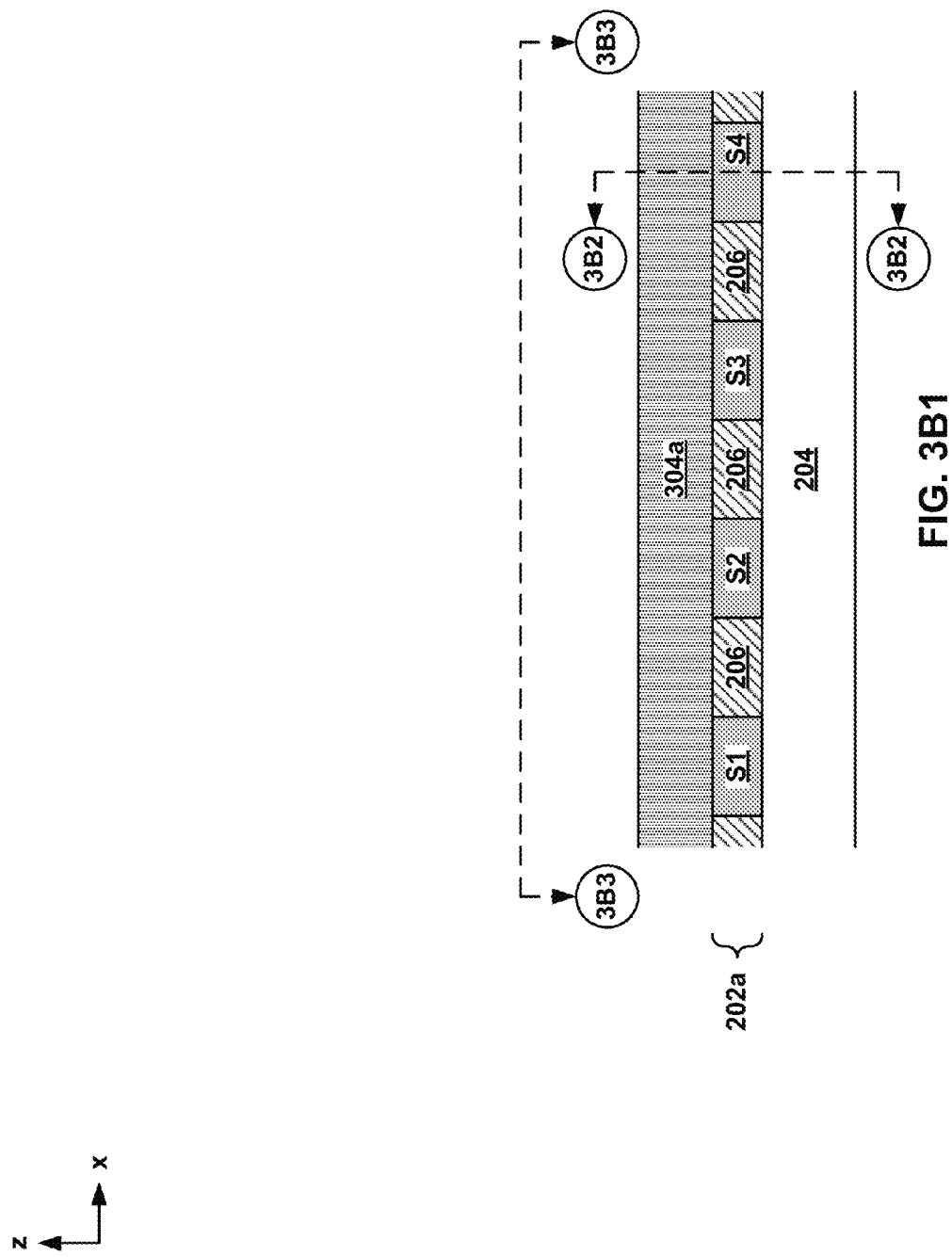

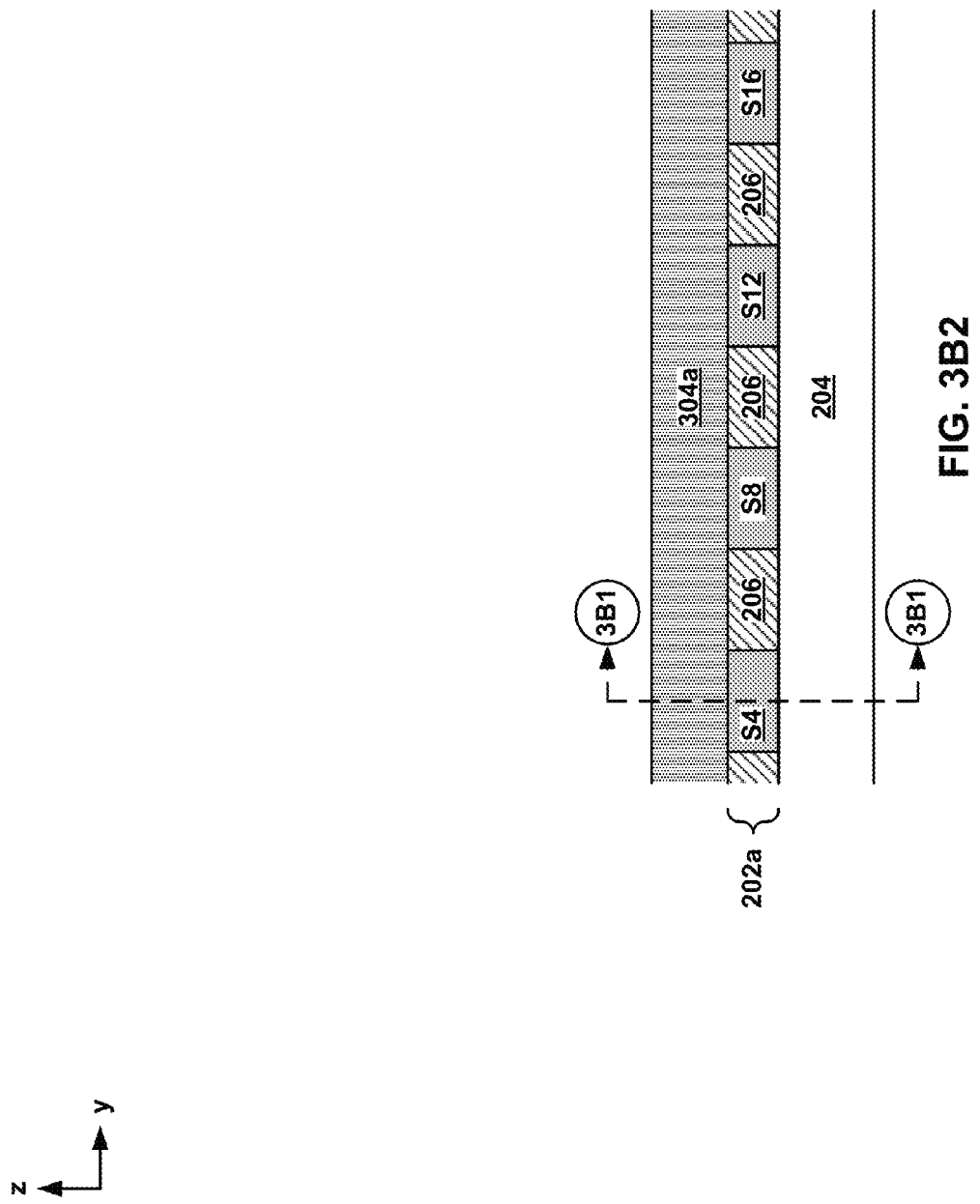

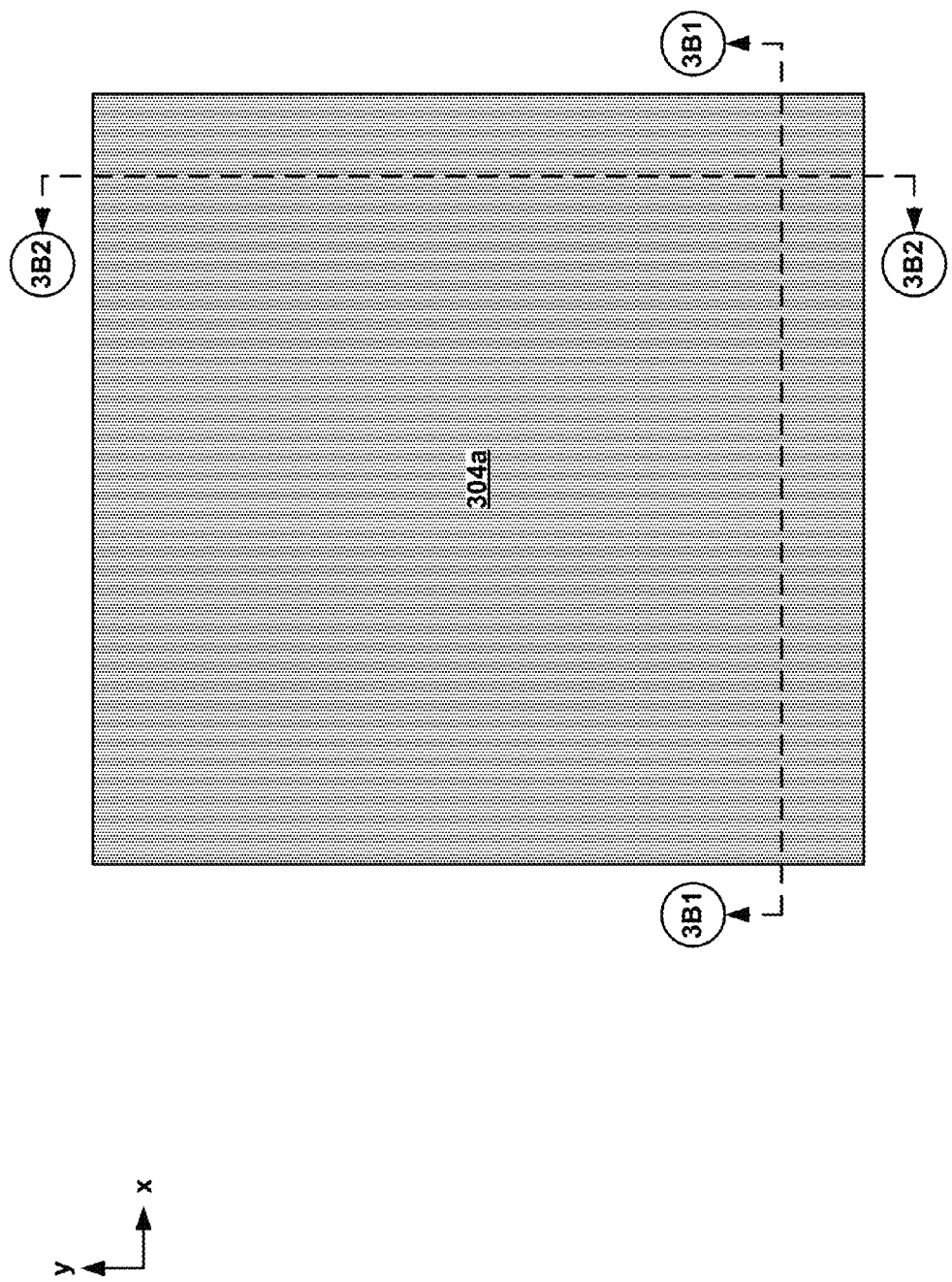

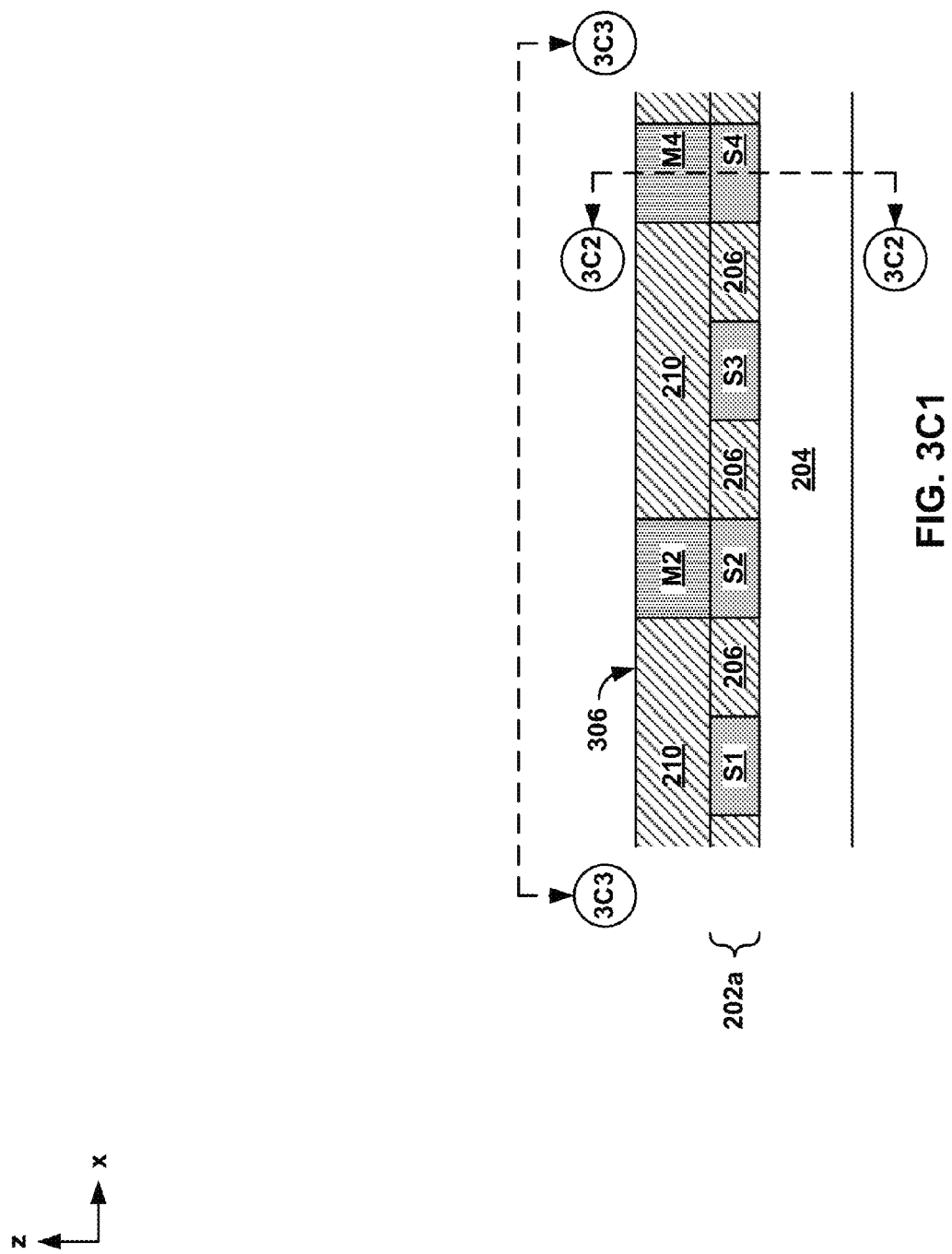

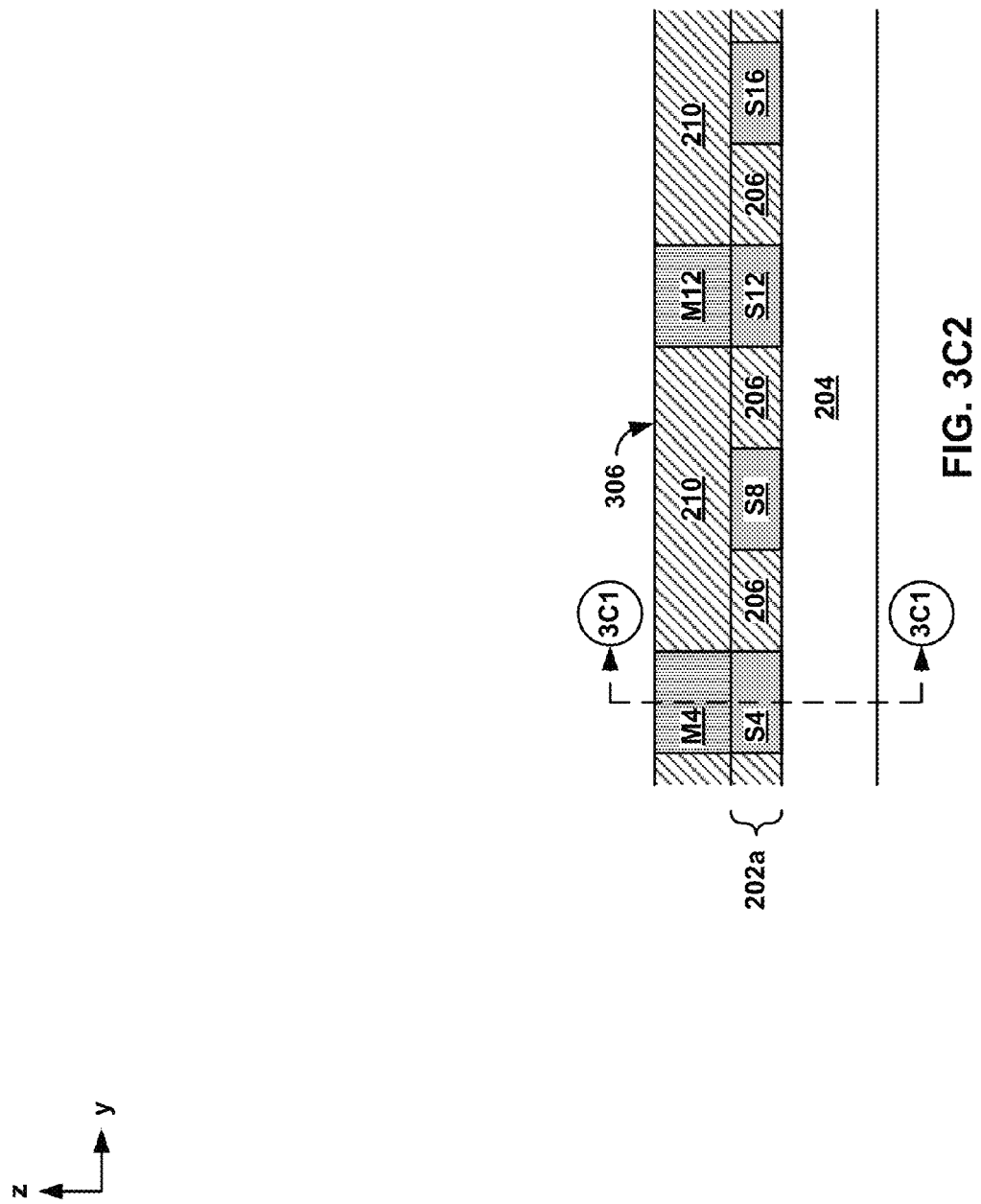

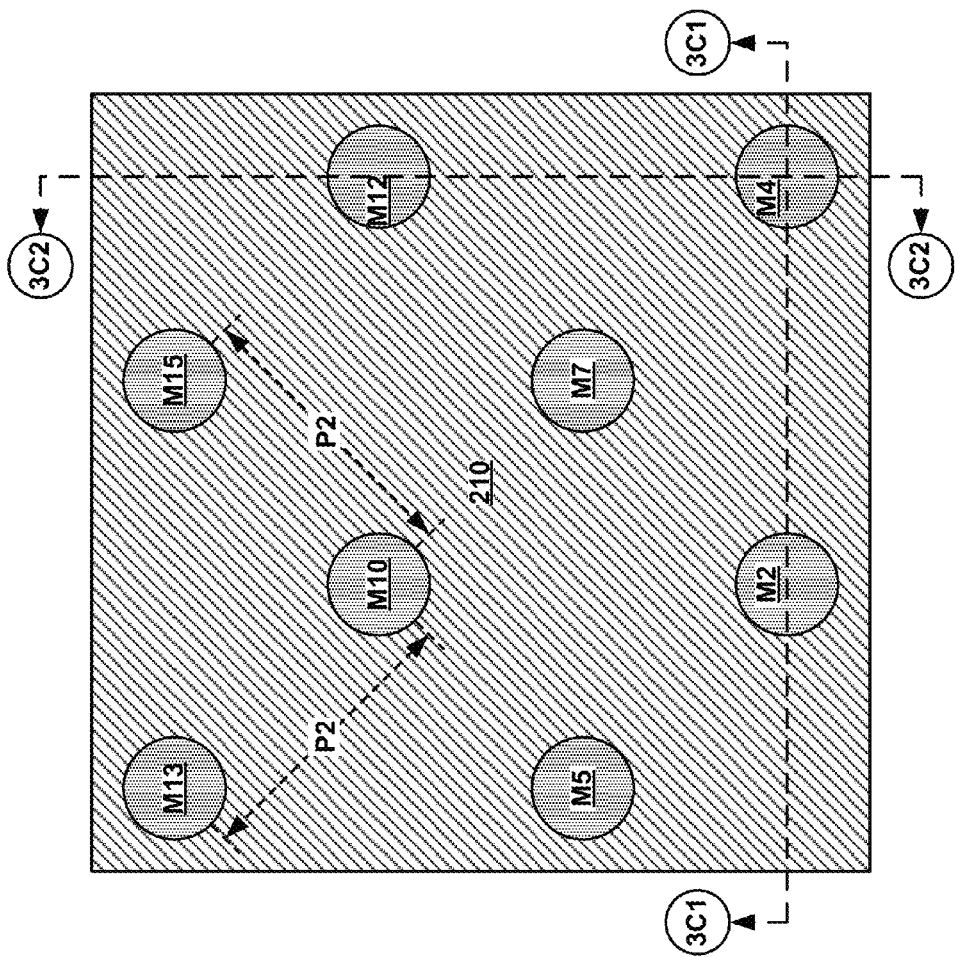
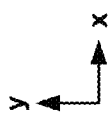
FIG. 3C3

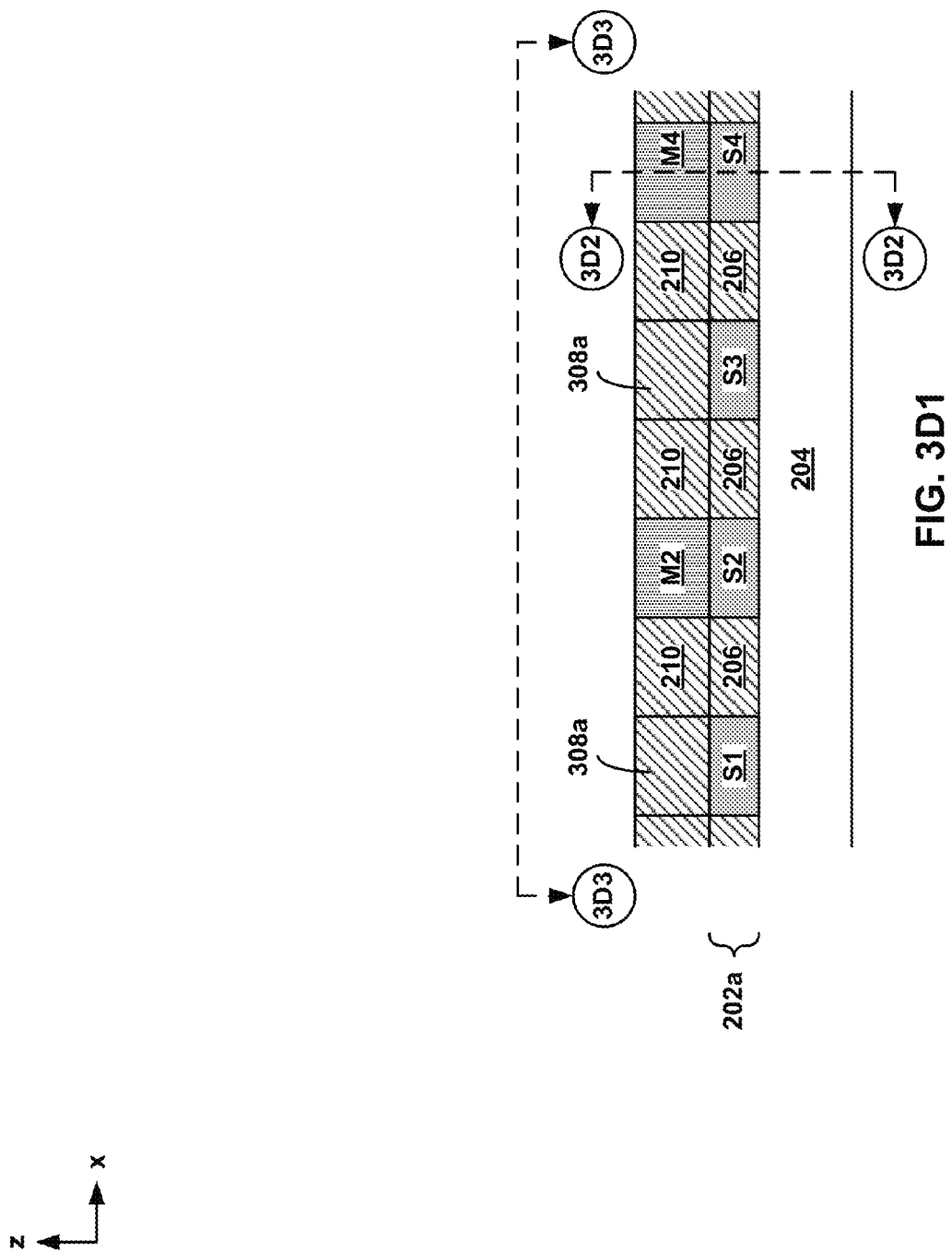

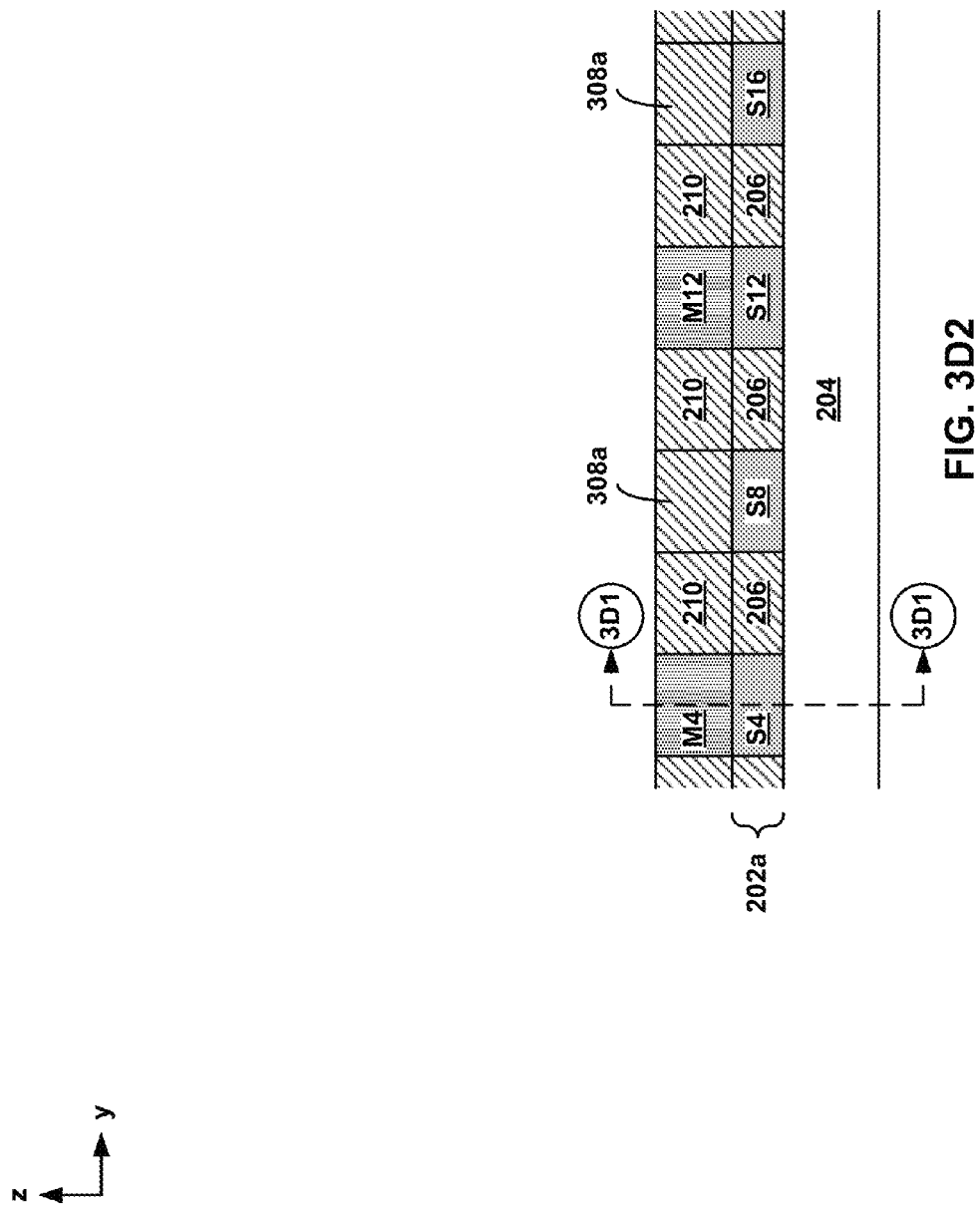

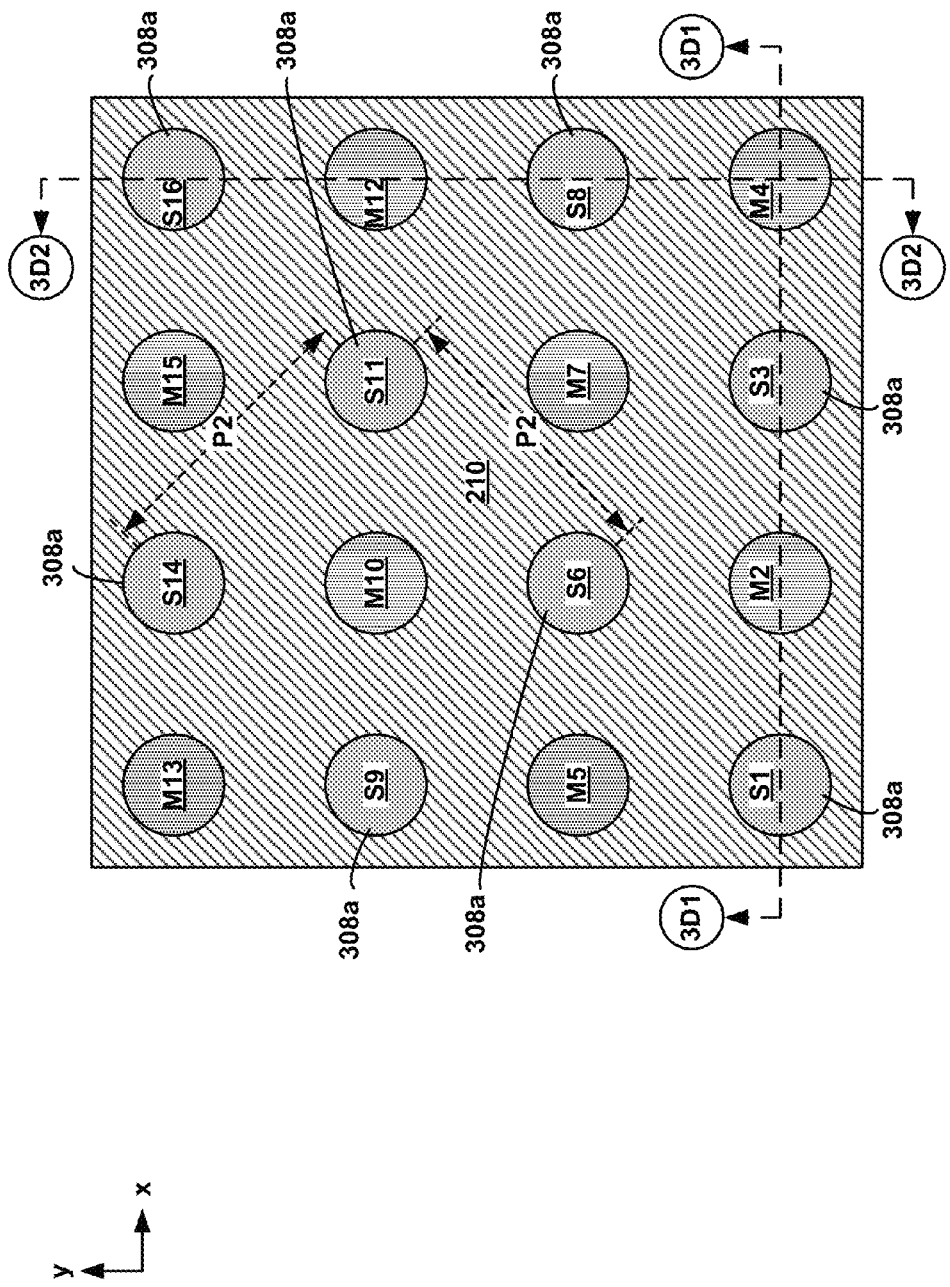

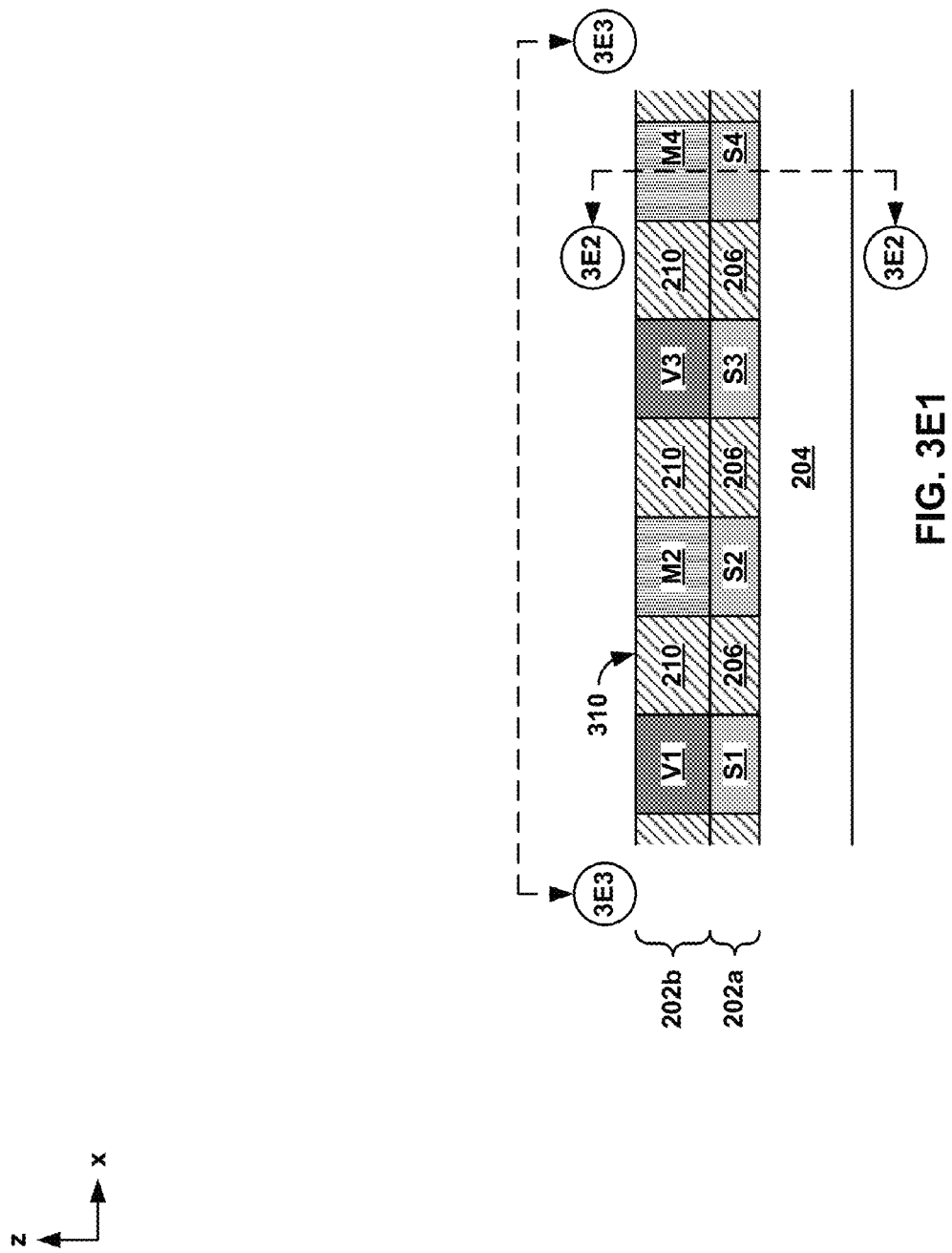

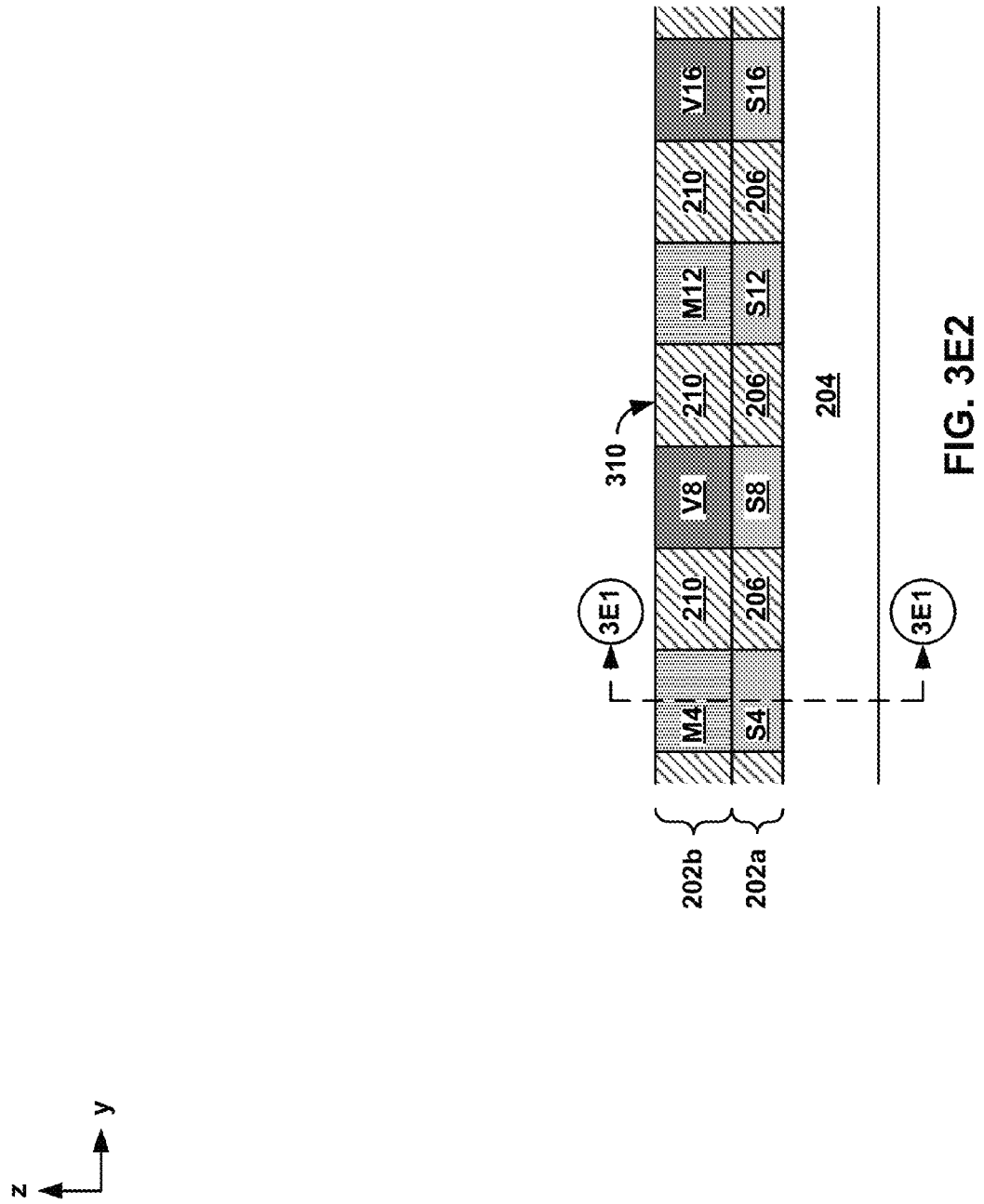

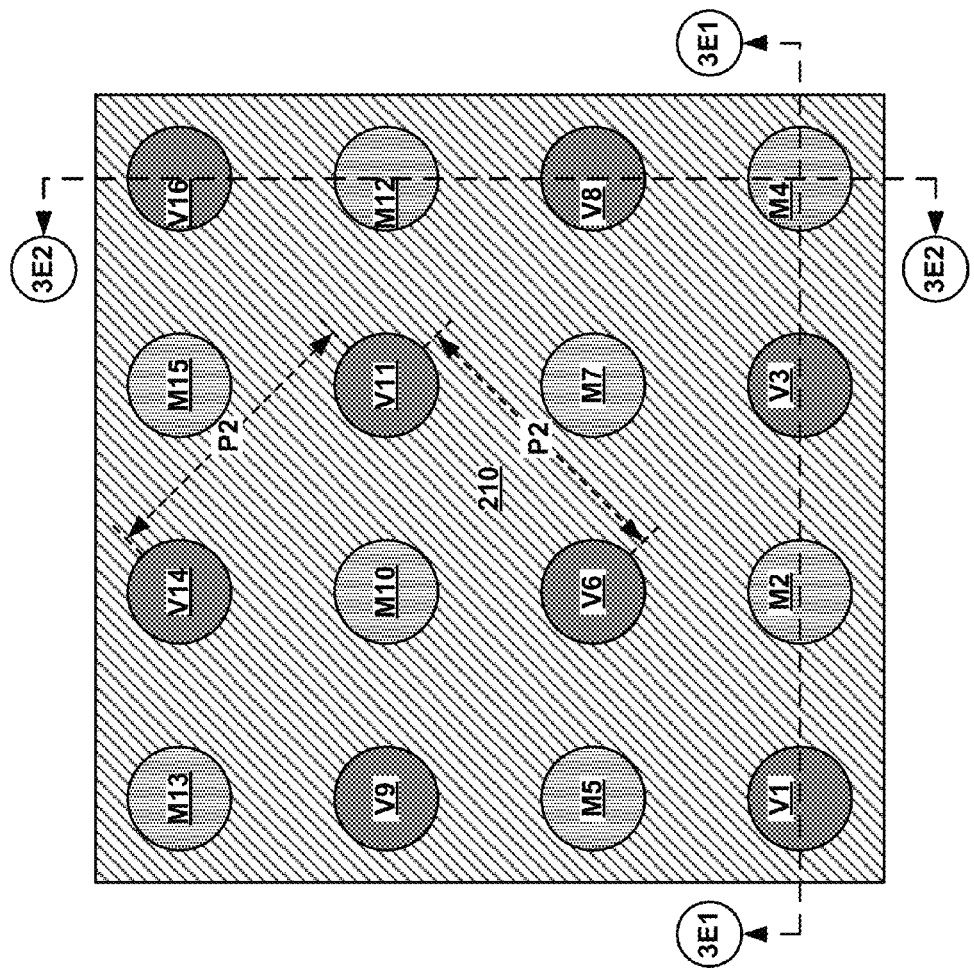
FIG. 3E3

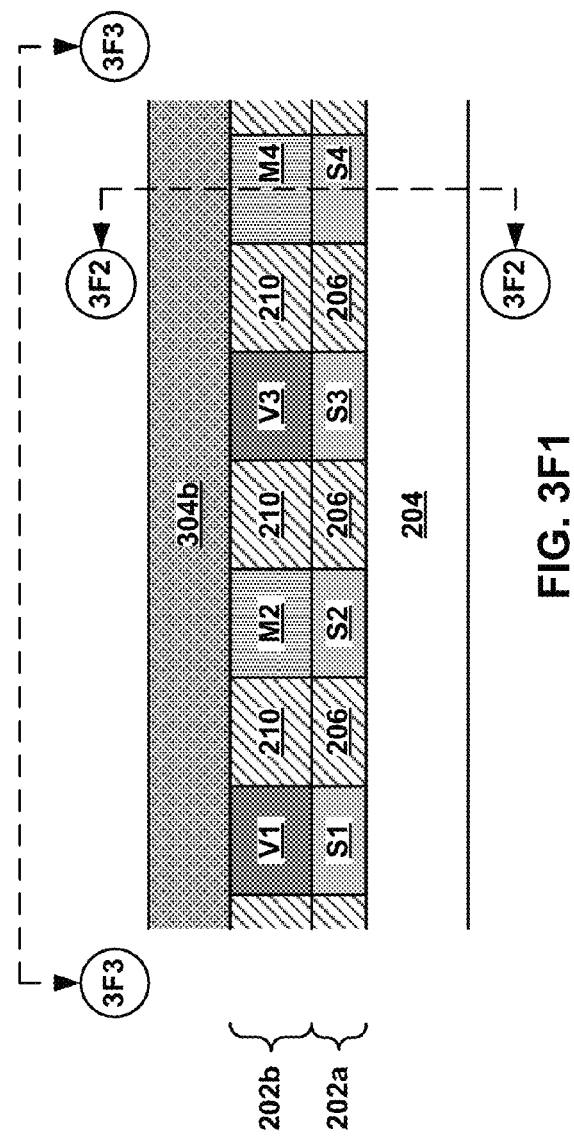
FIG. 3F1

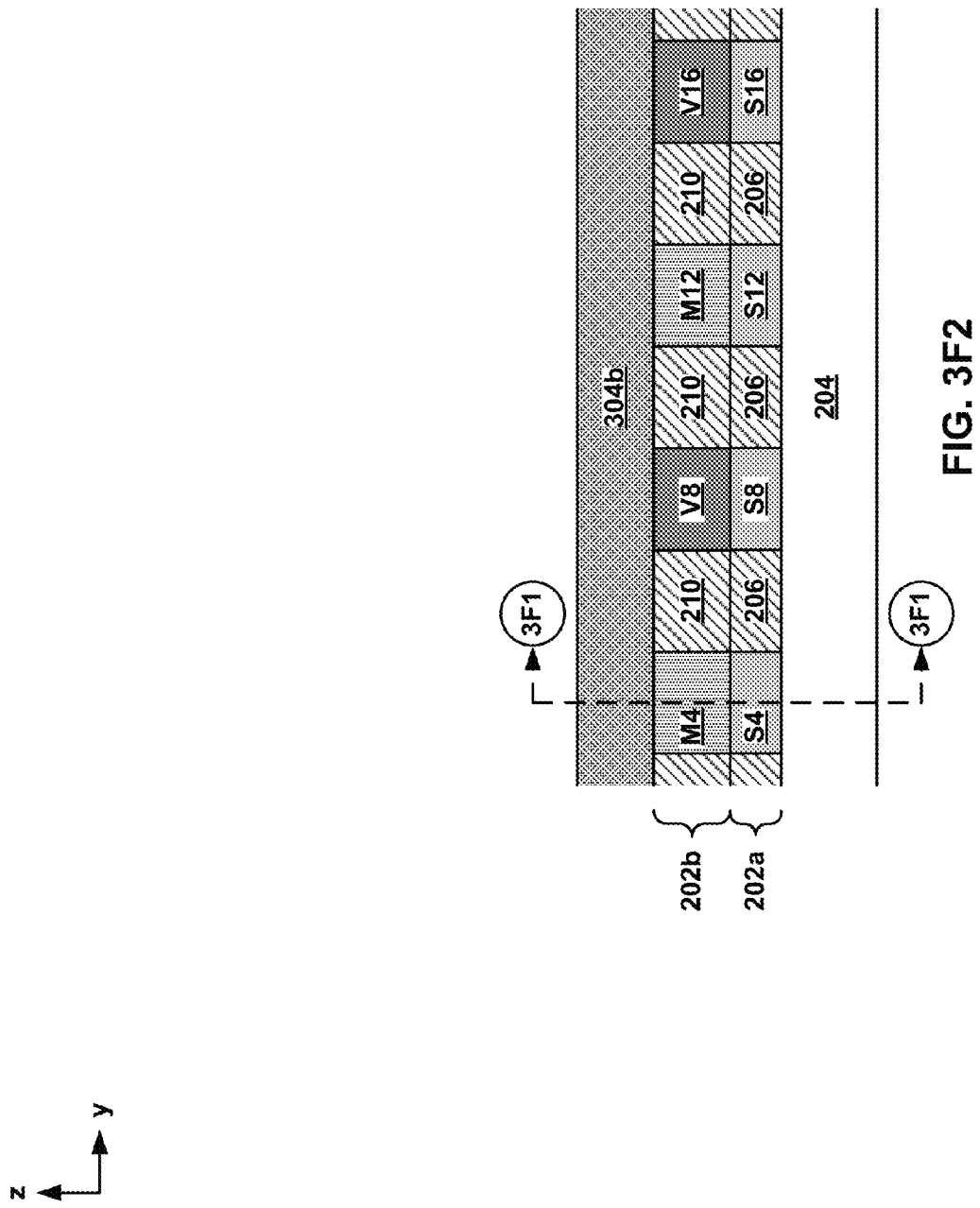
FIG. 3F2

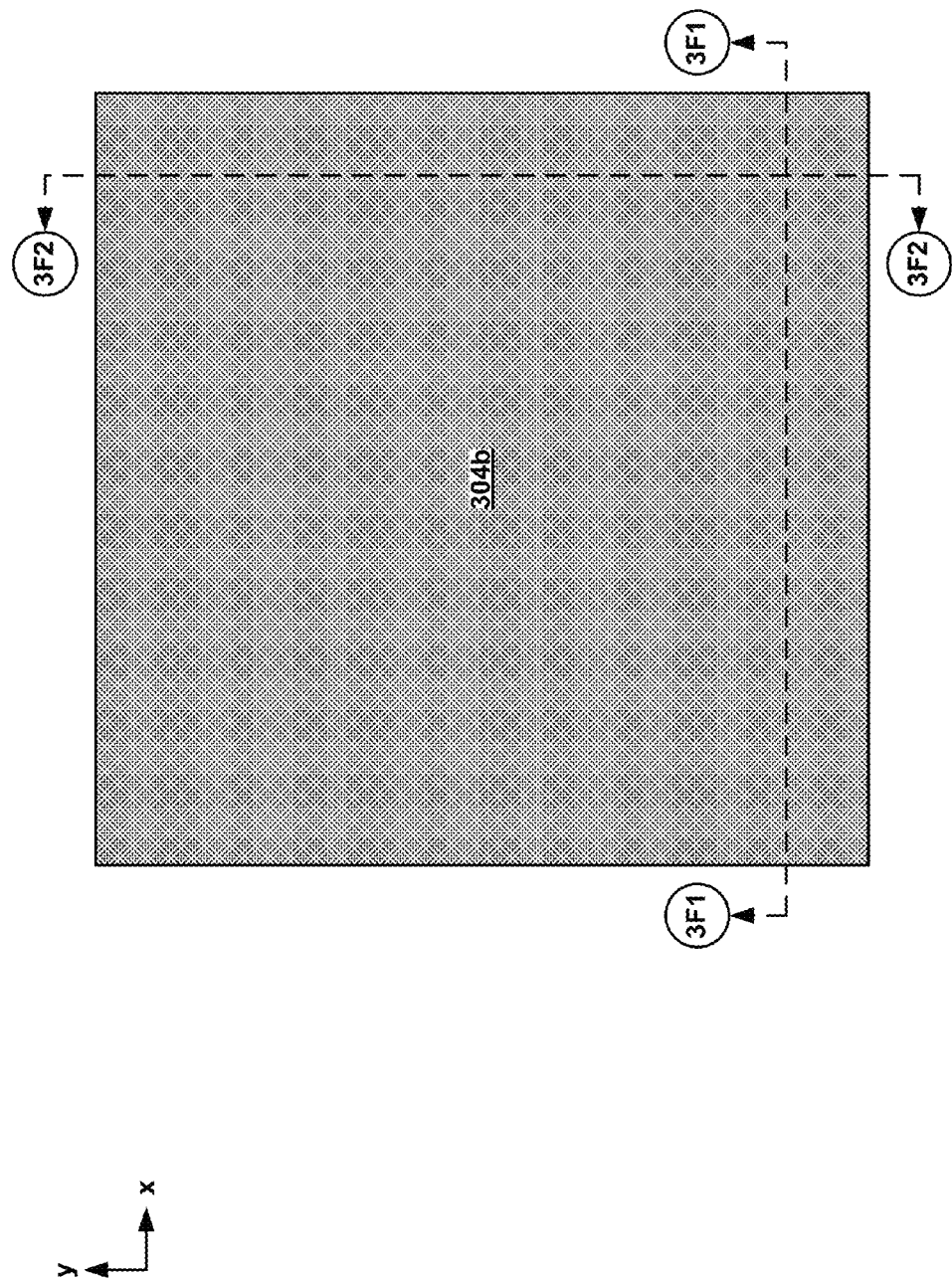
FIG. 3F3

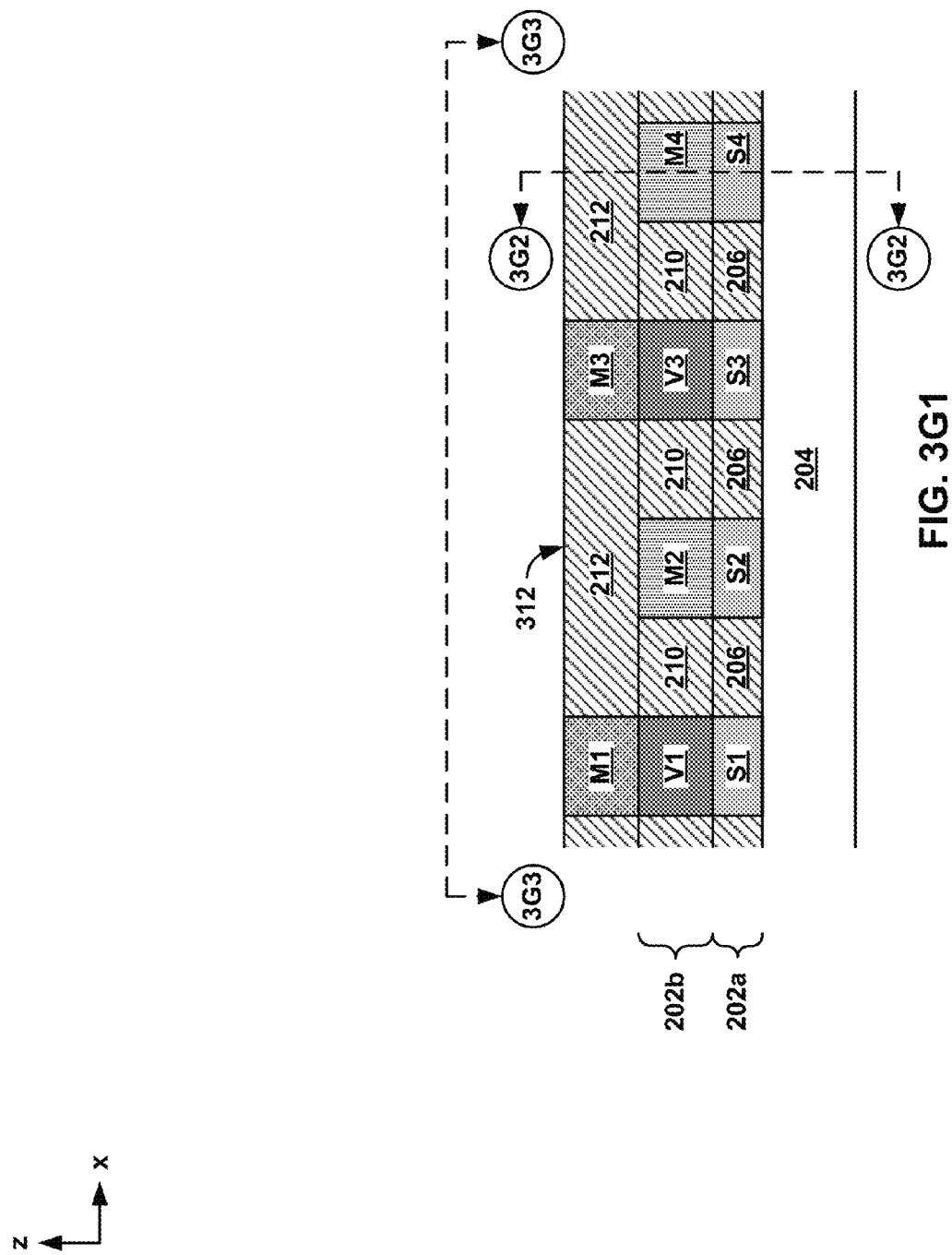

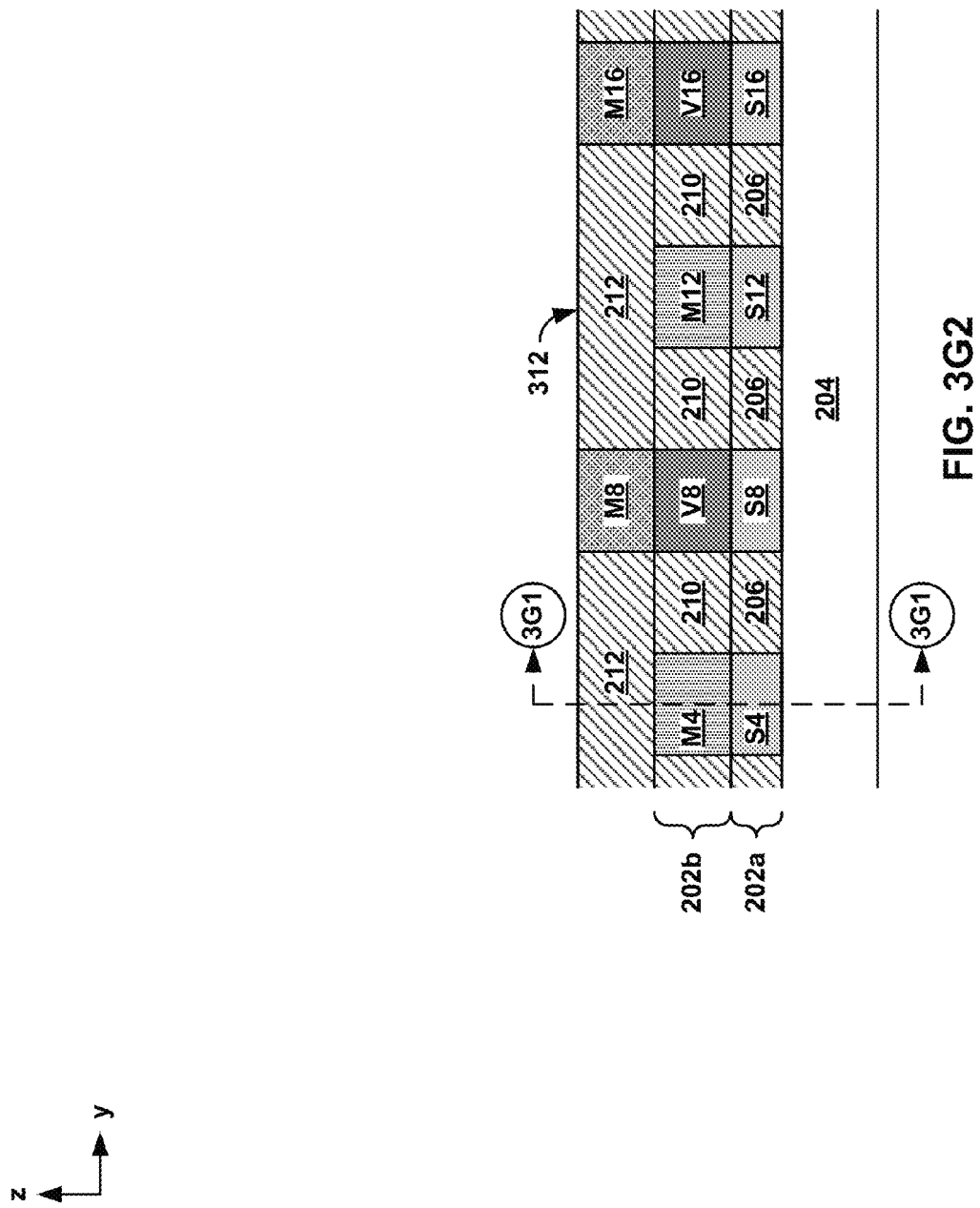

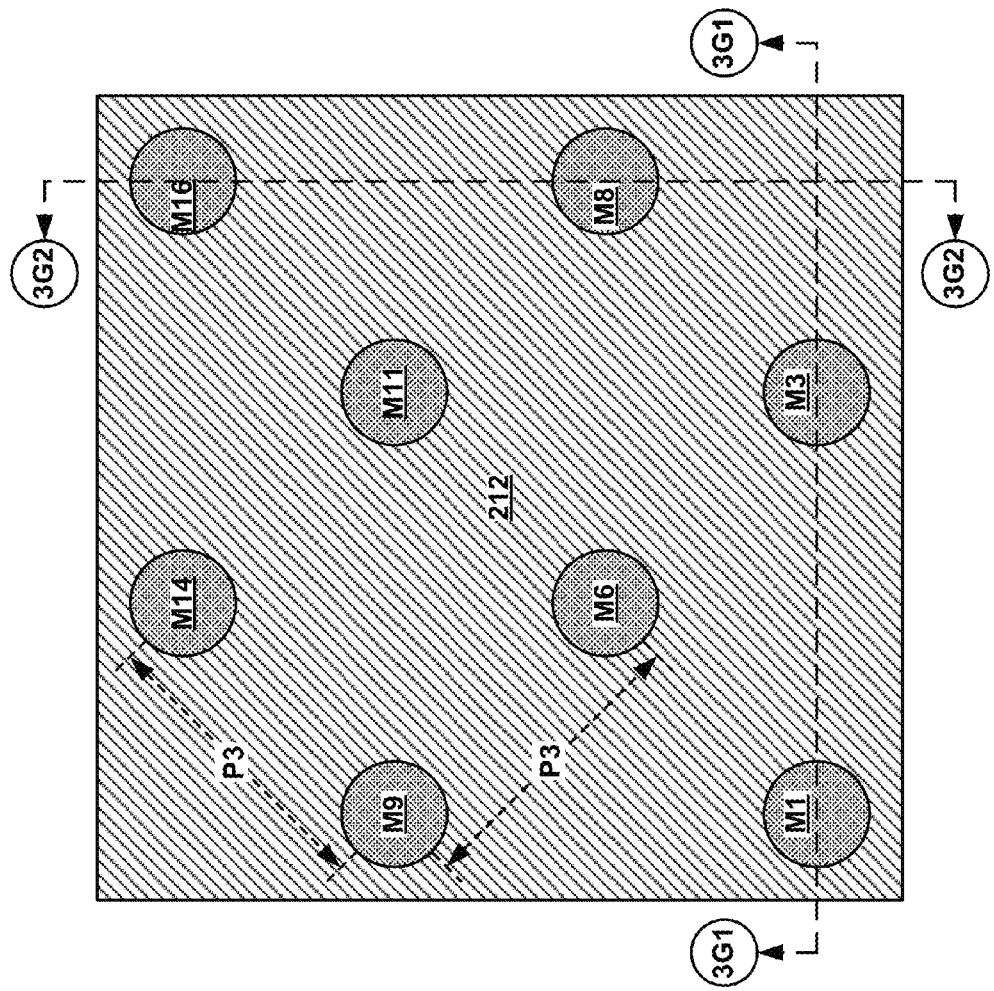
FIG. 3G3

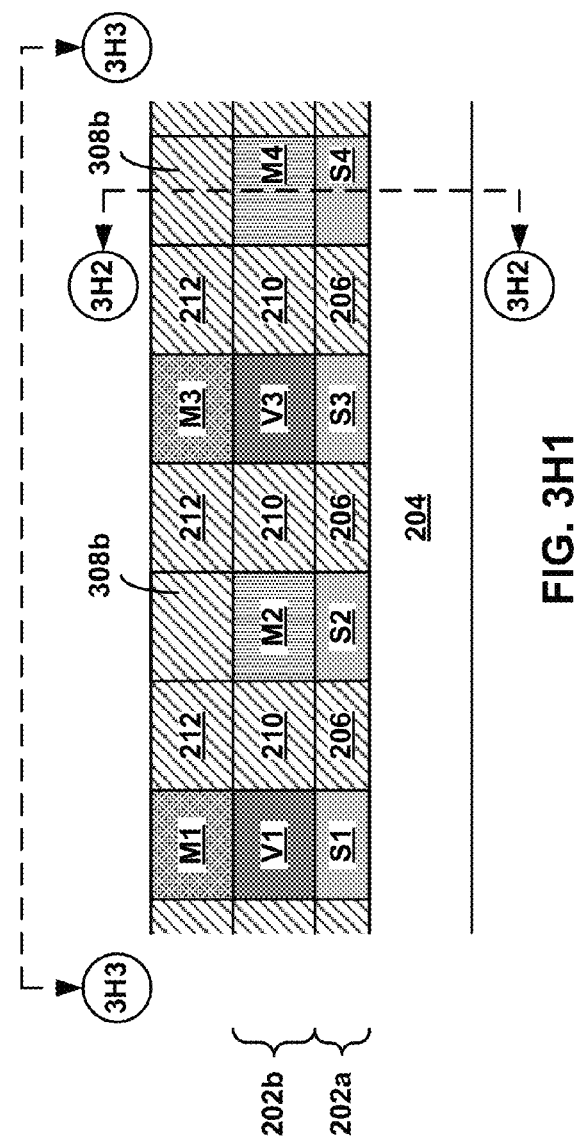
FIG. 3H1

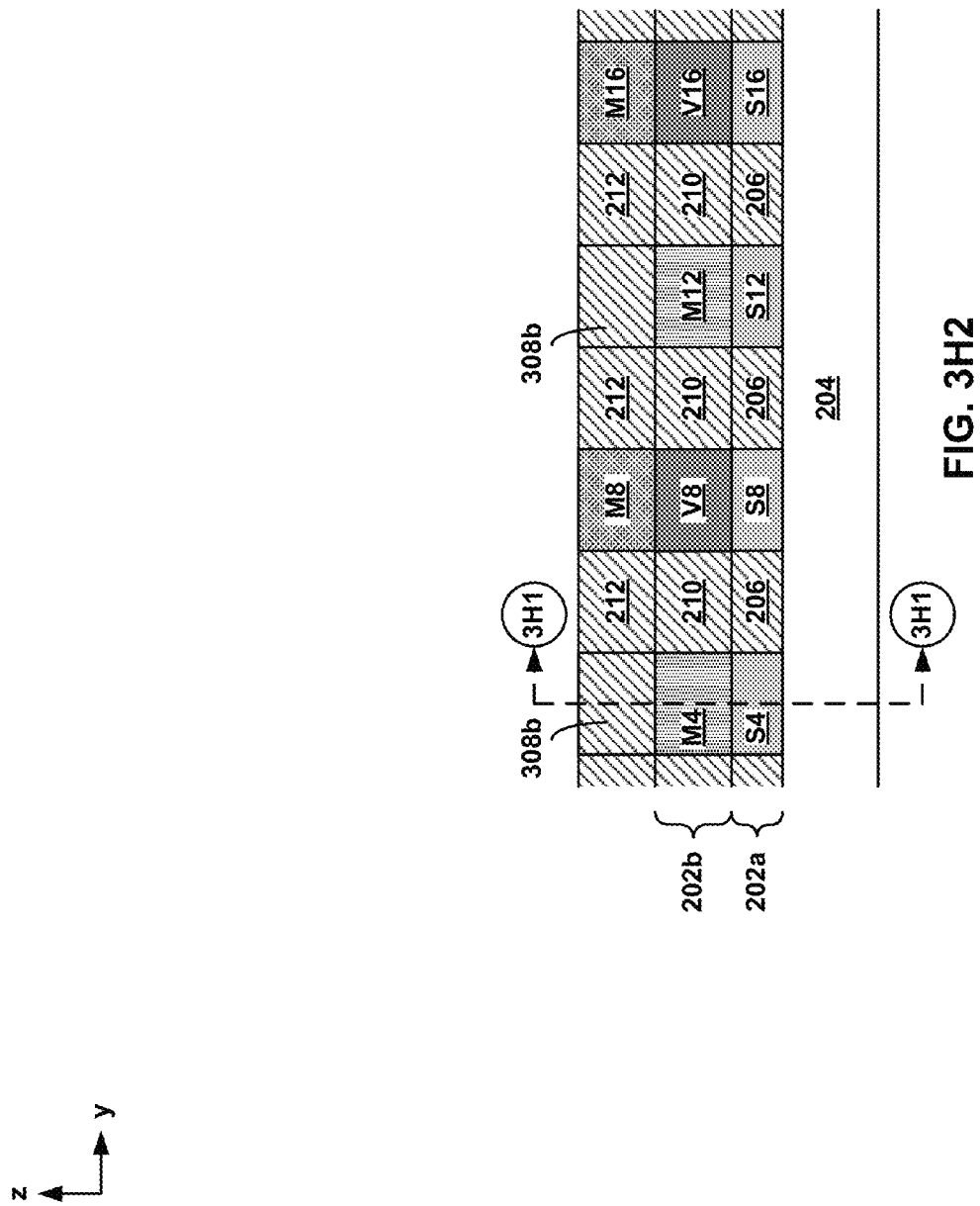

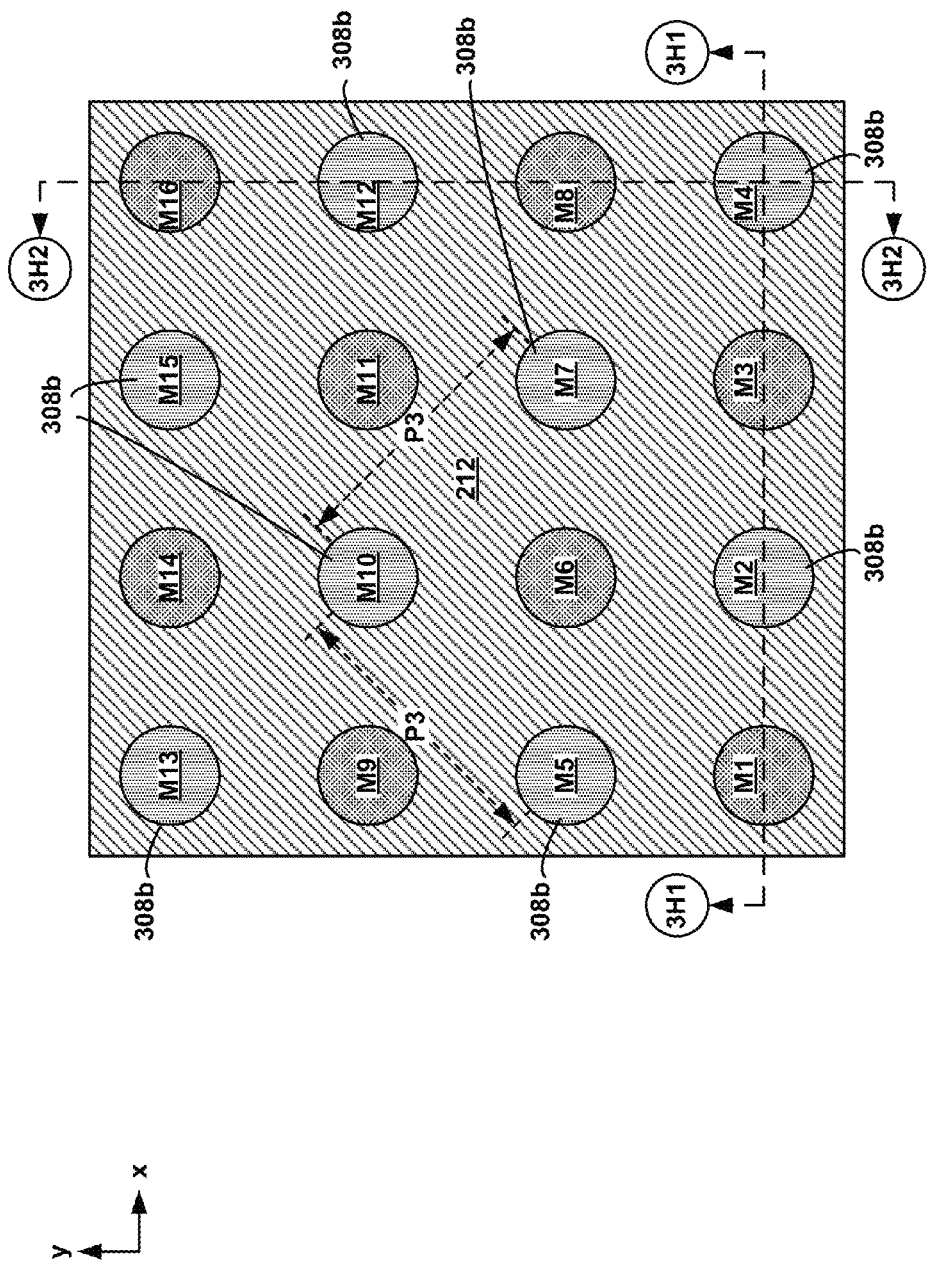
FIG. 3H3

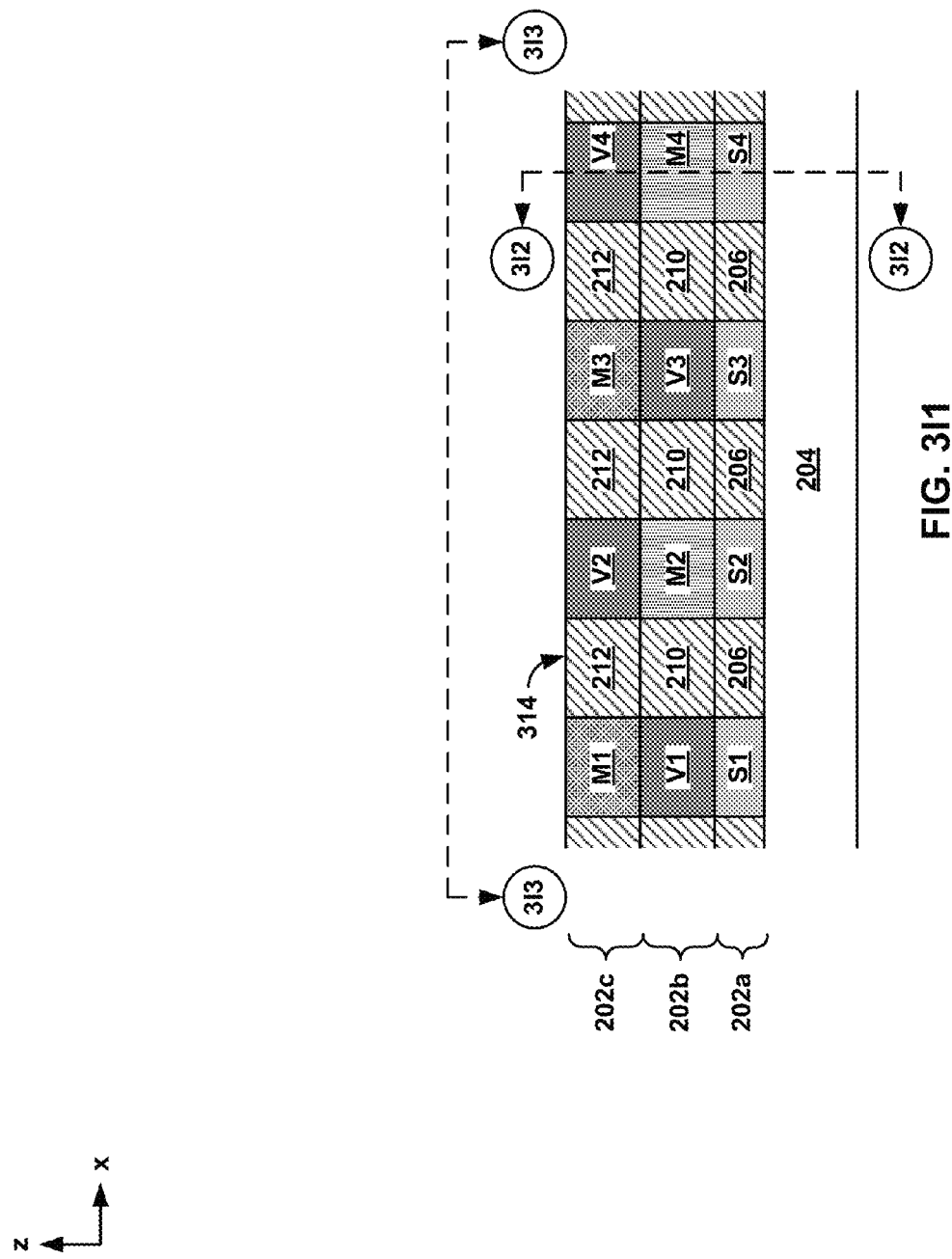

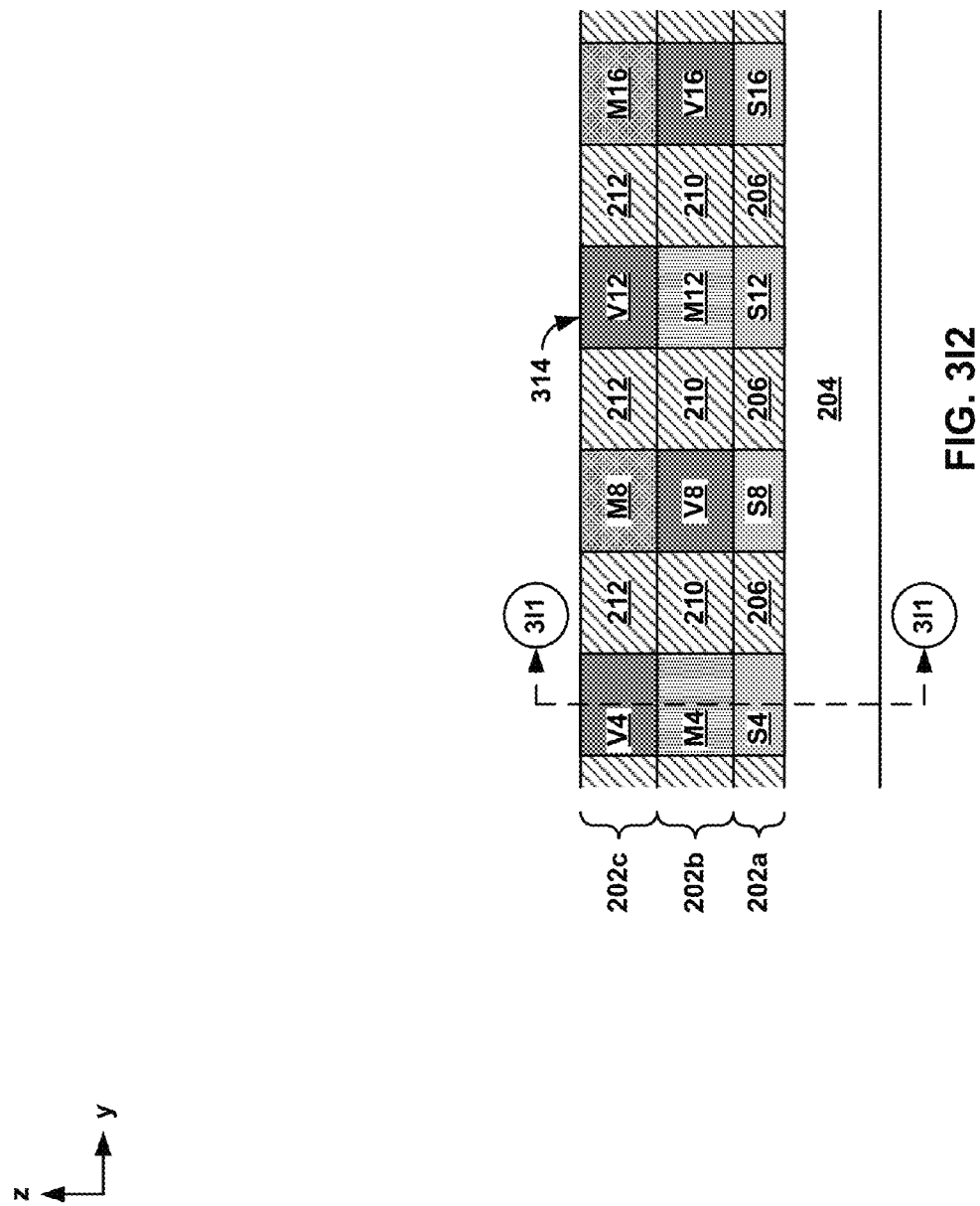
FIG. 3I2

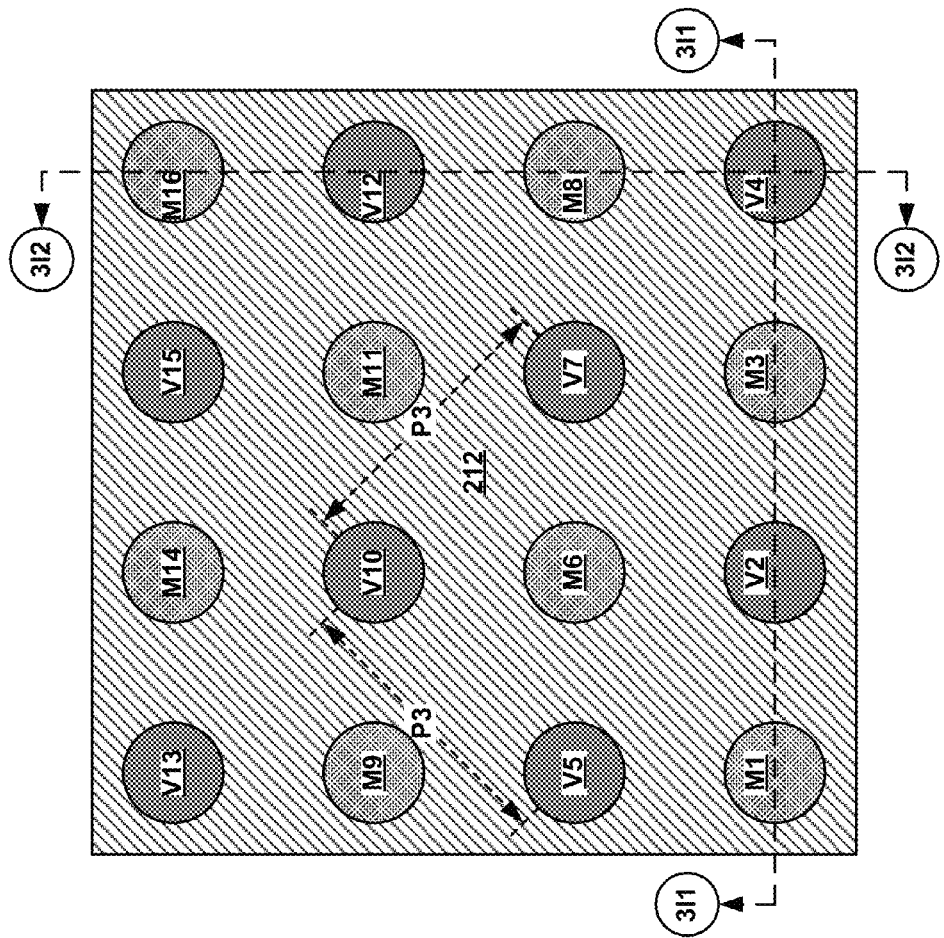
FIG. 3I3

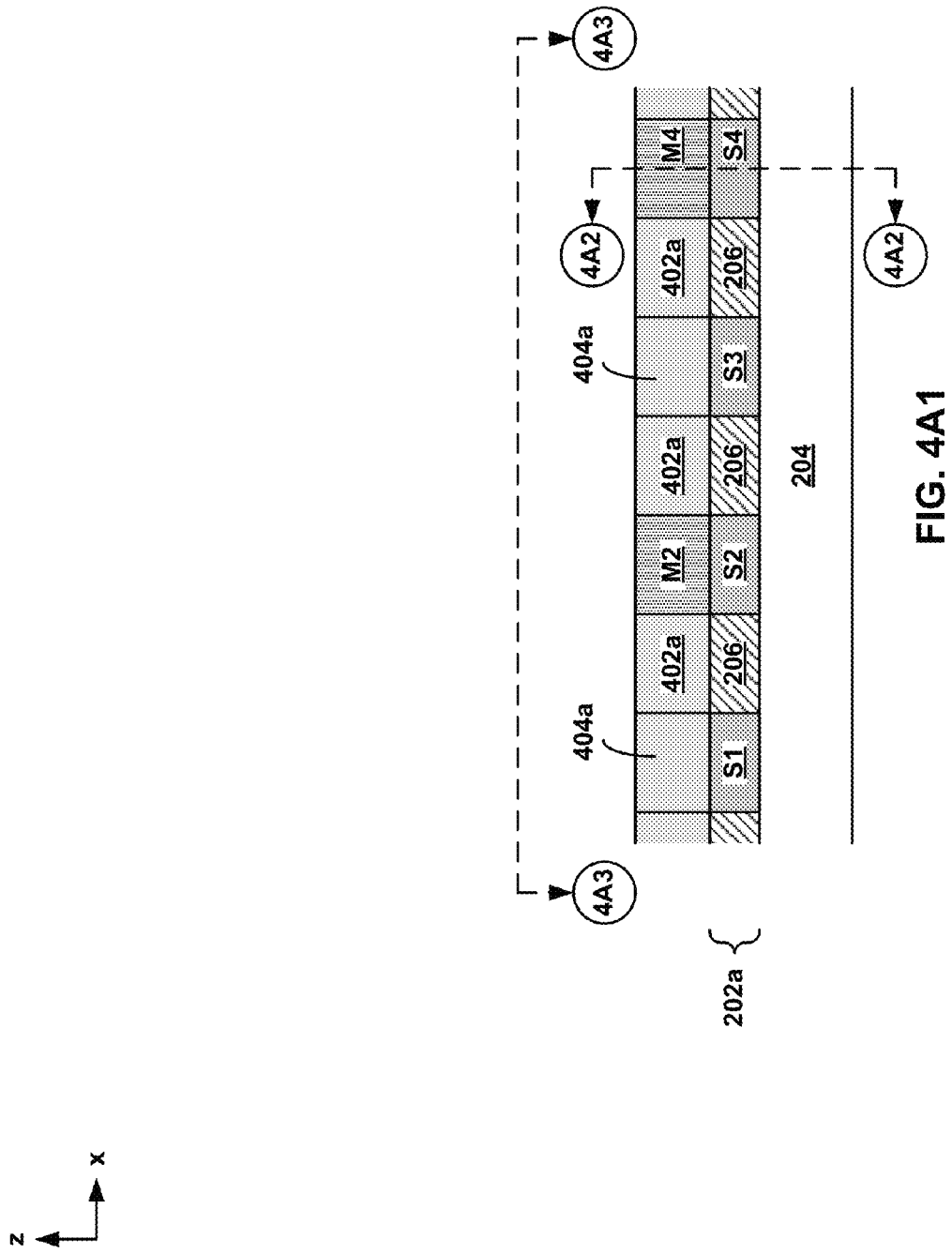

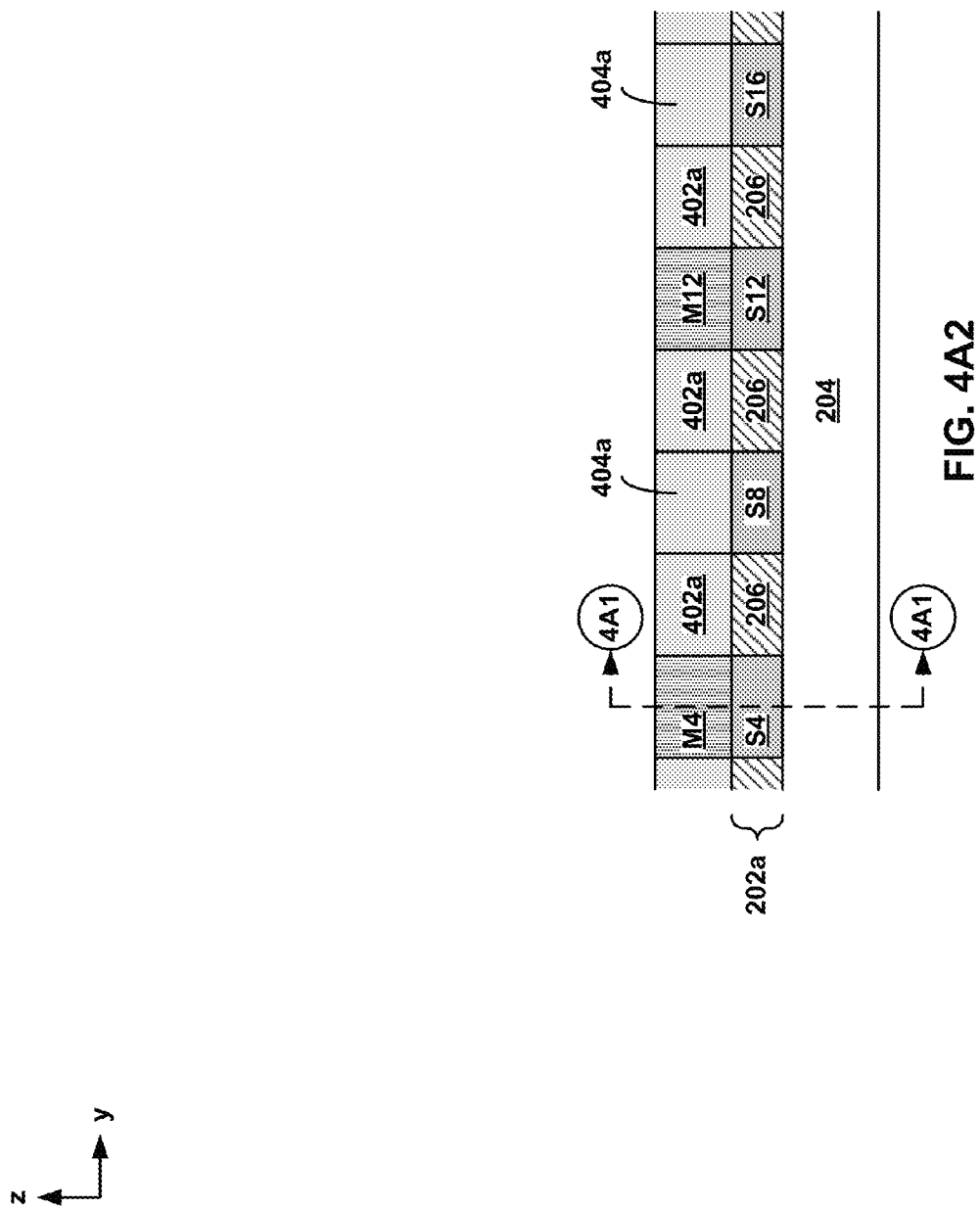
FIG. 4A2

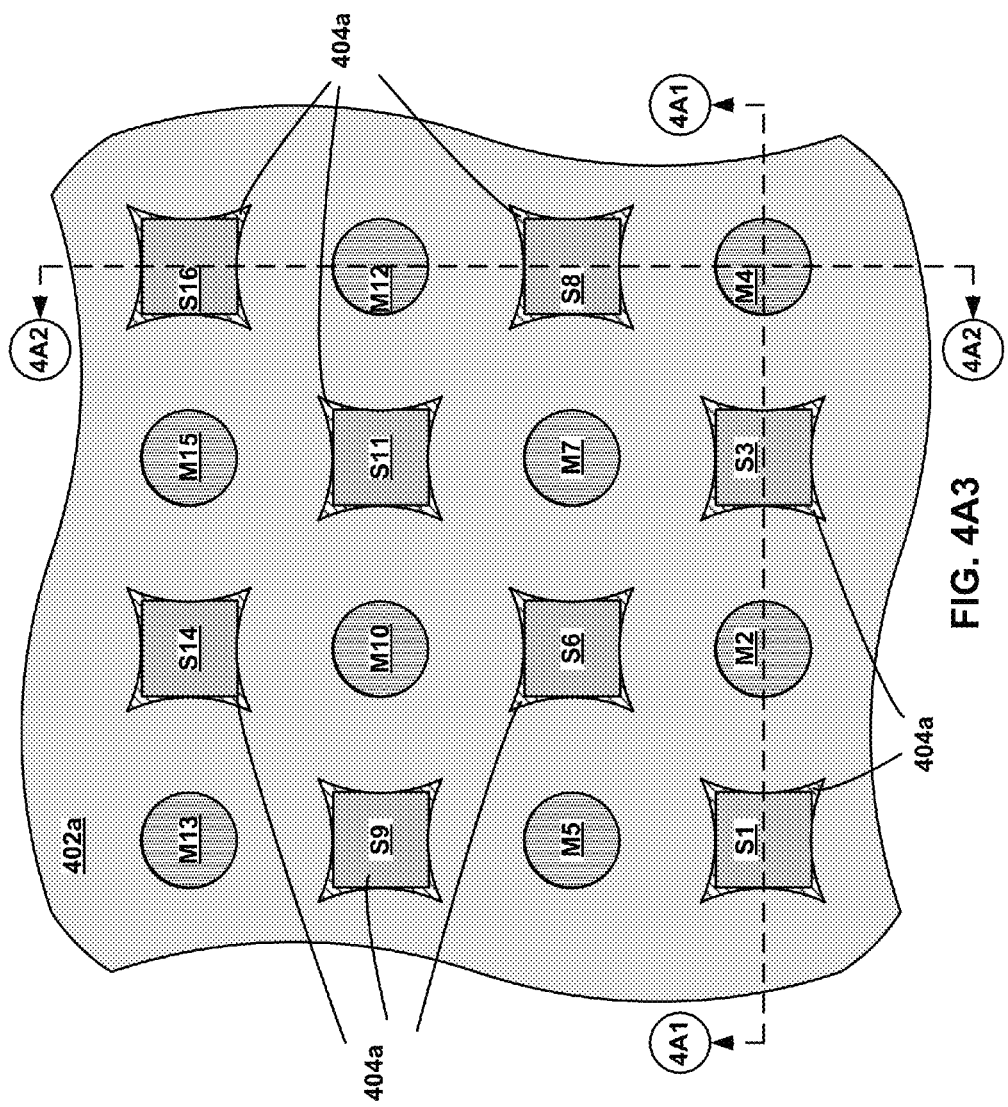
FIG. 4A3

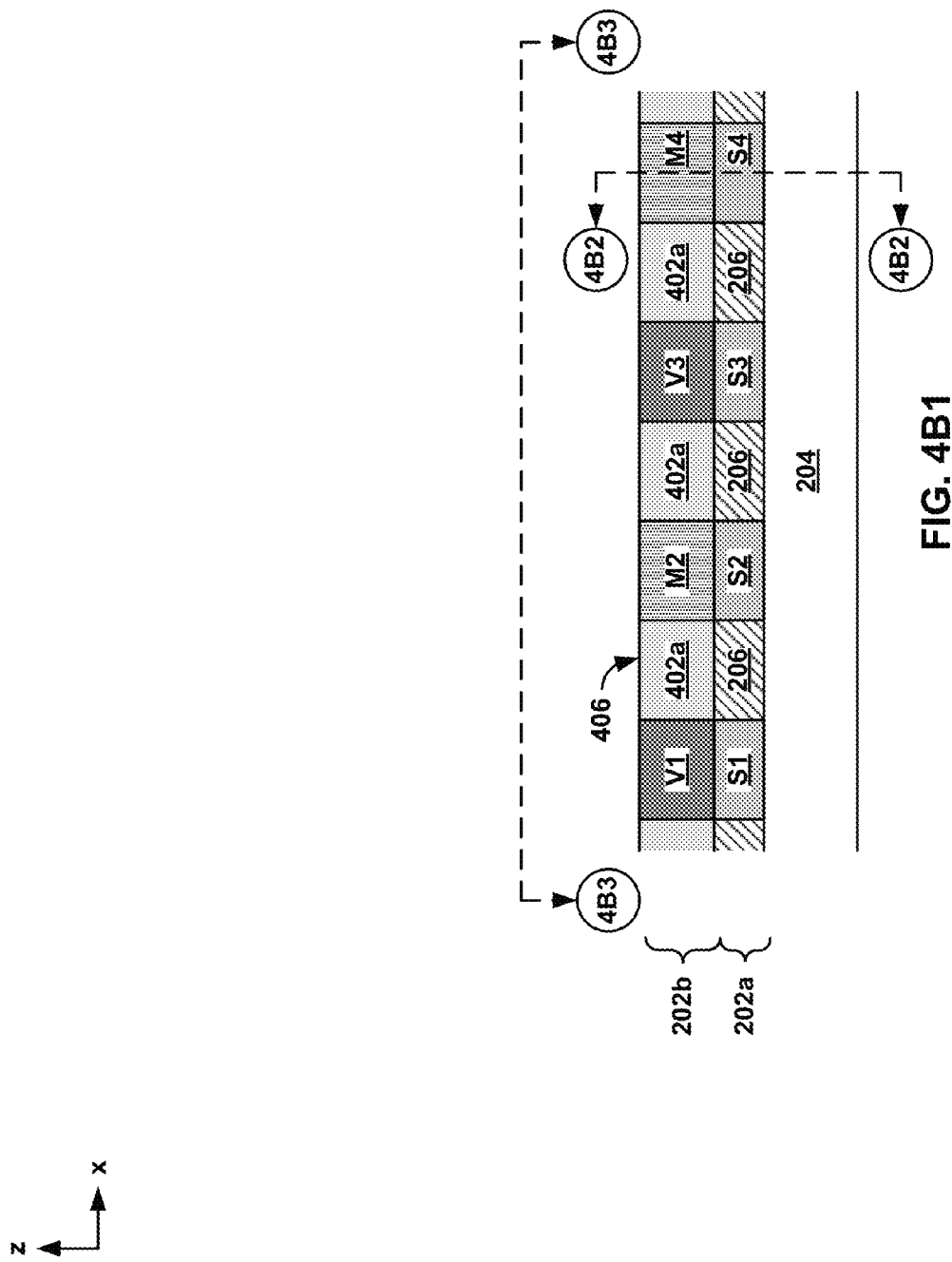

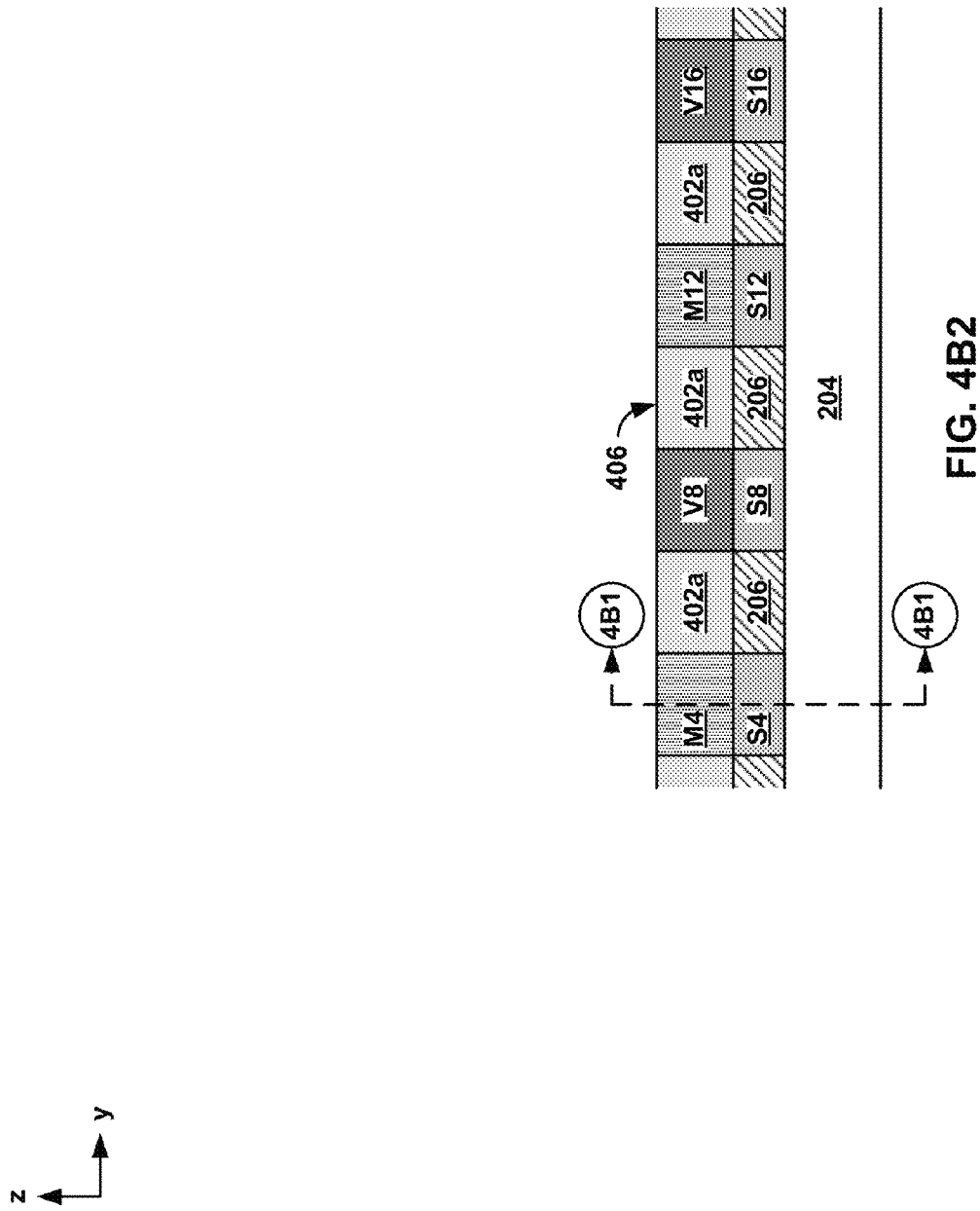
FIG. 4B2

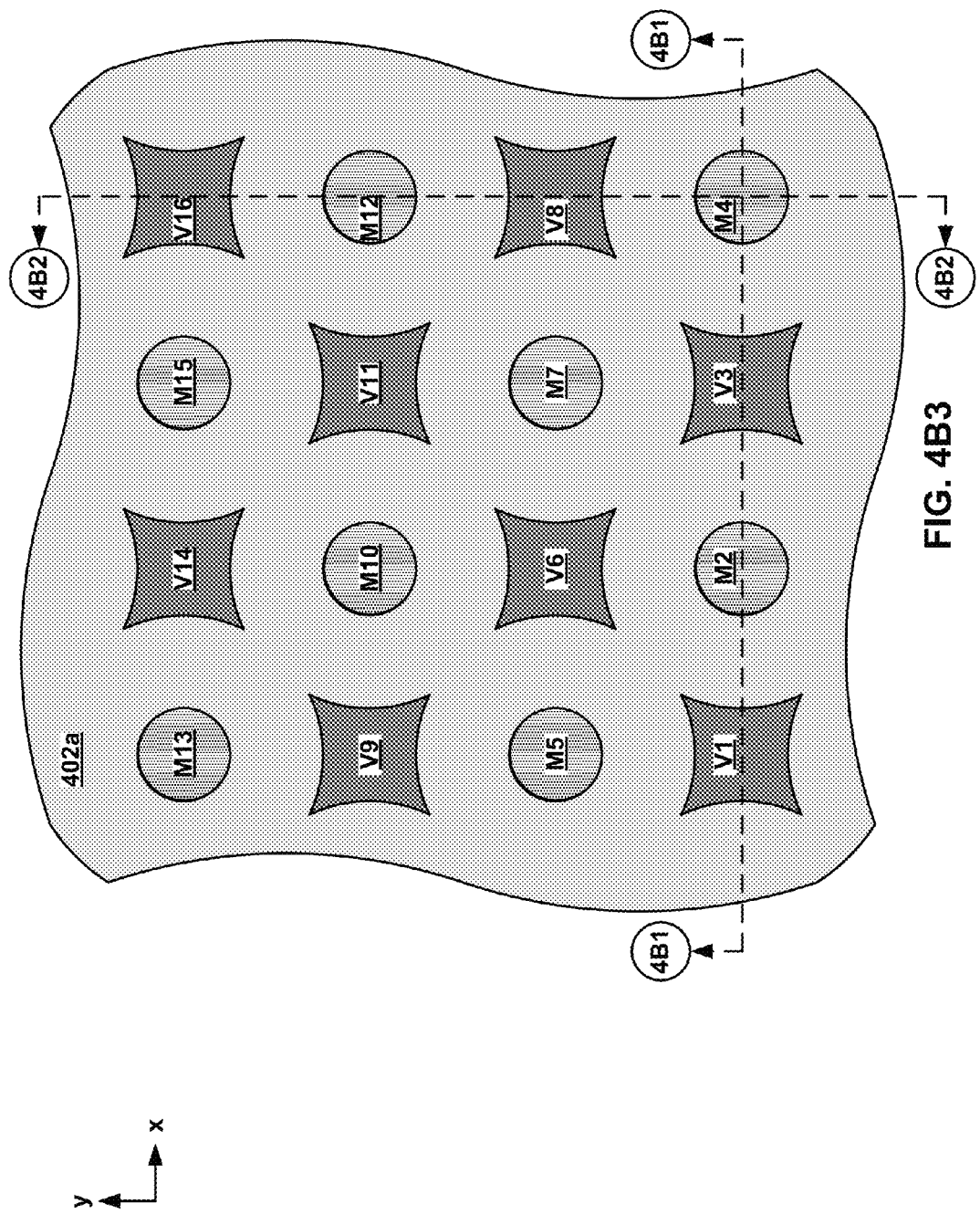
FIG. 4B3

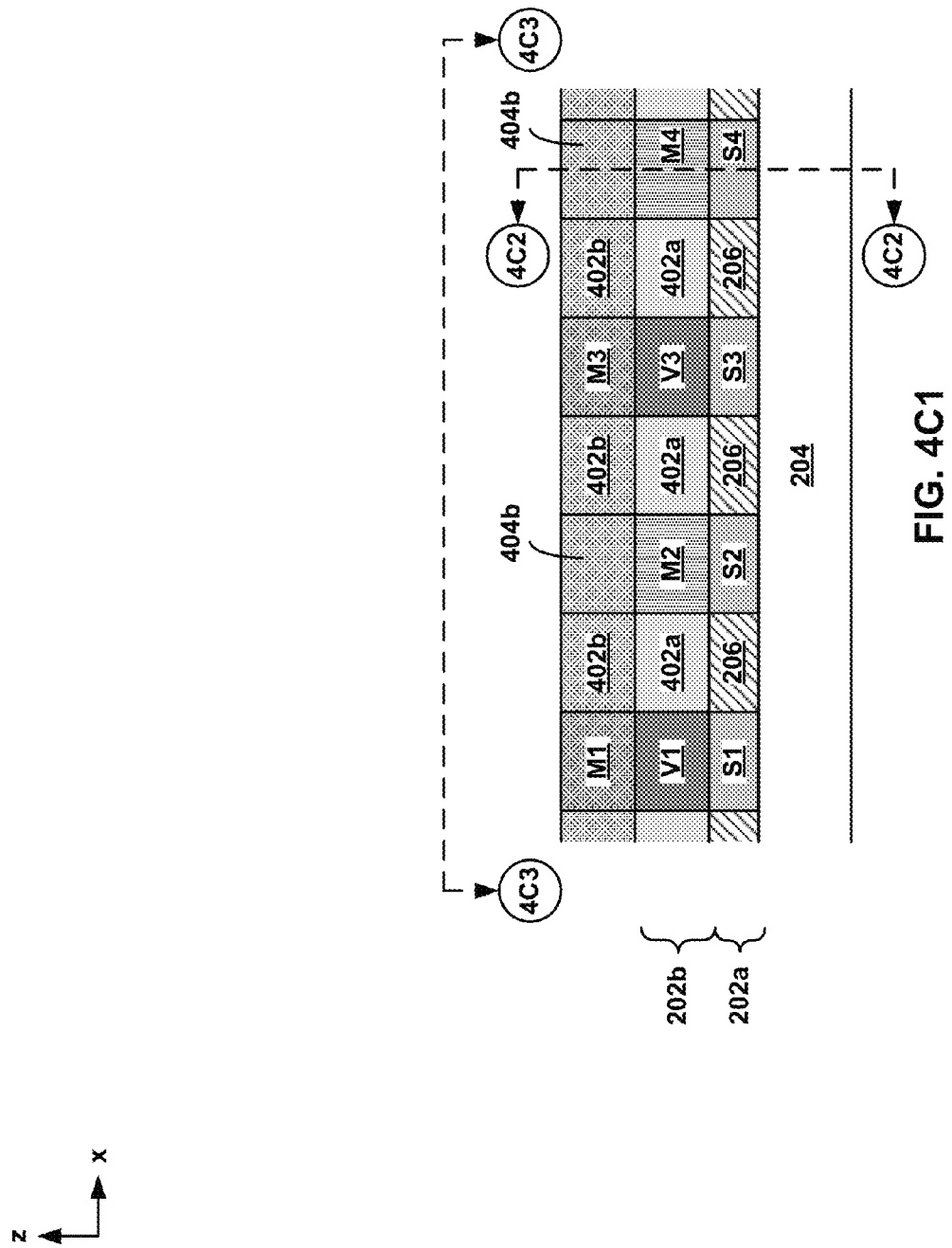

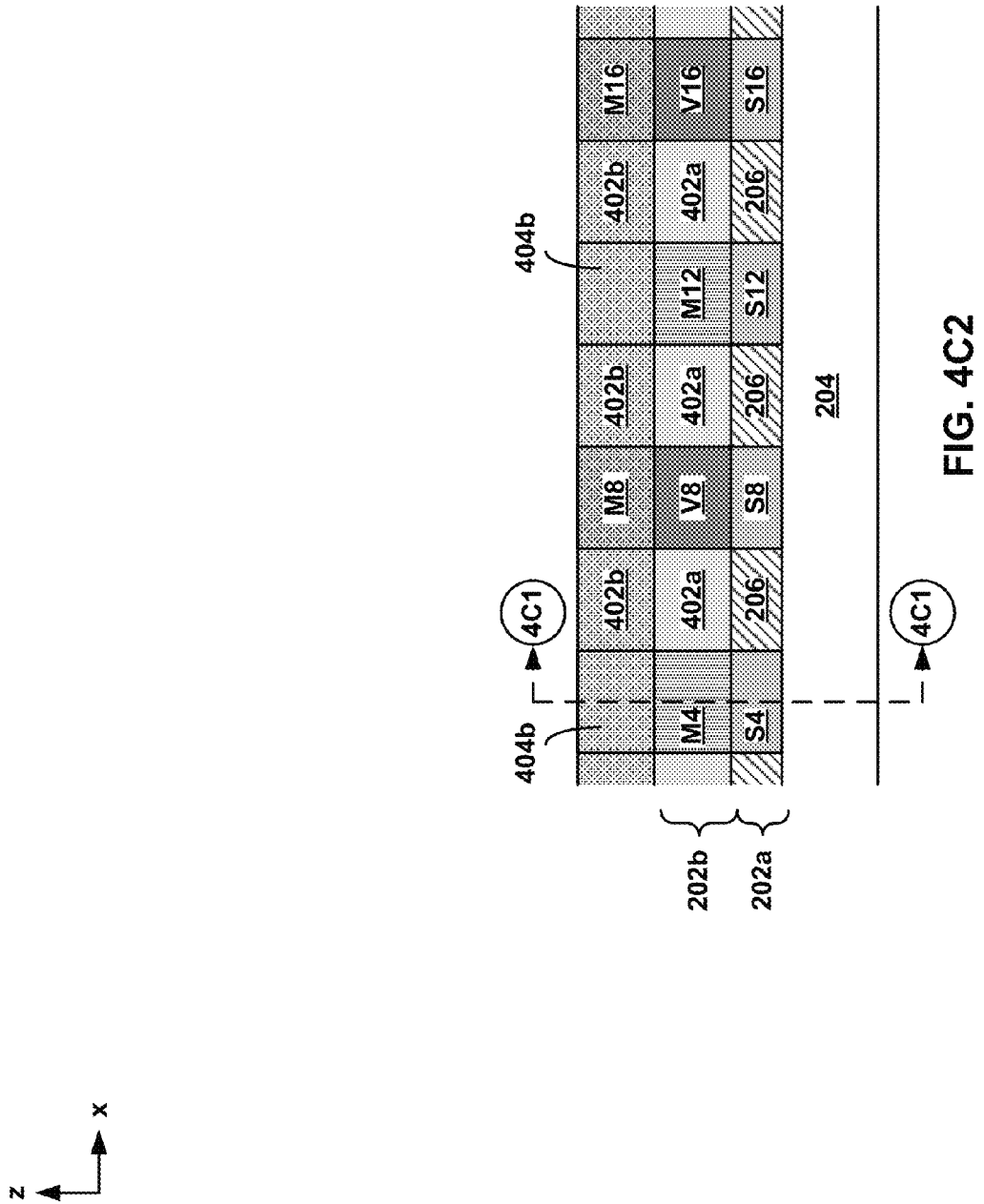

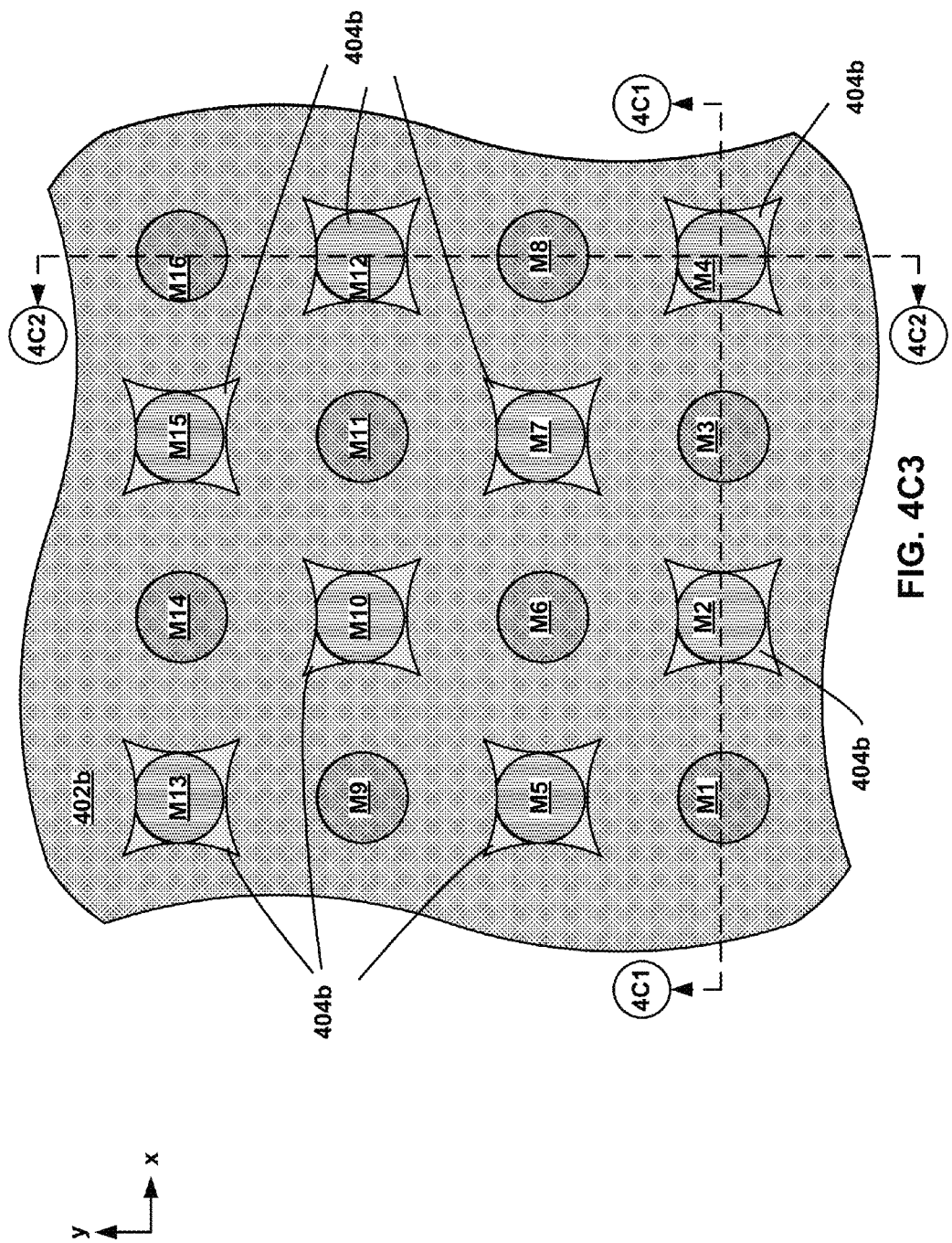
FIG. 4C3

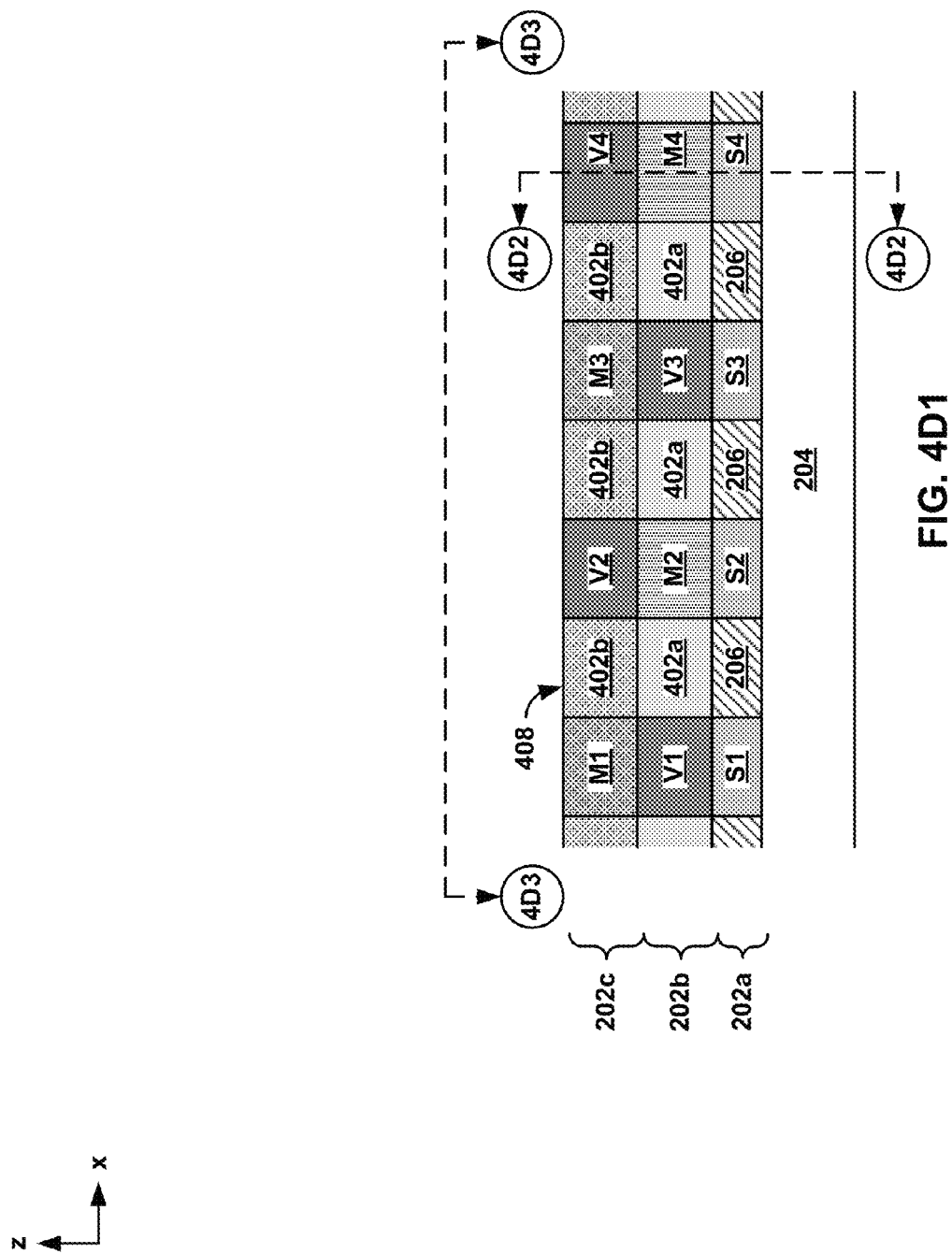
FIG. 4D1

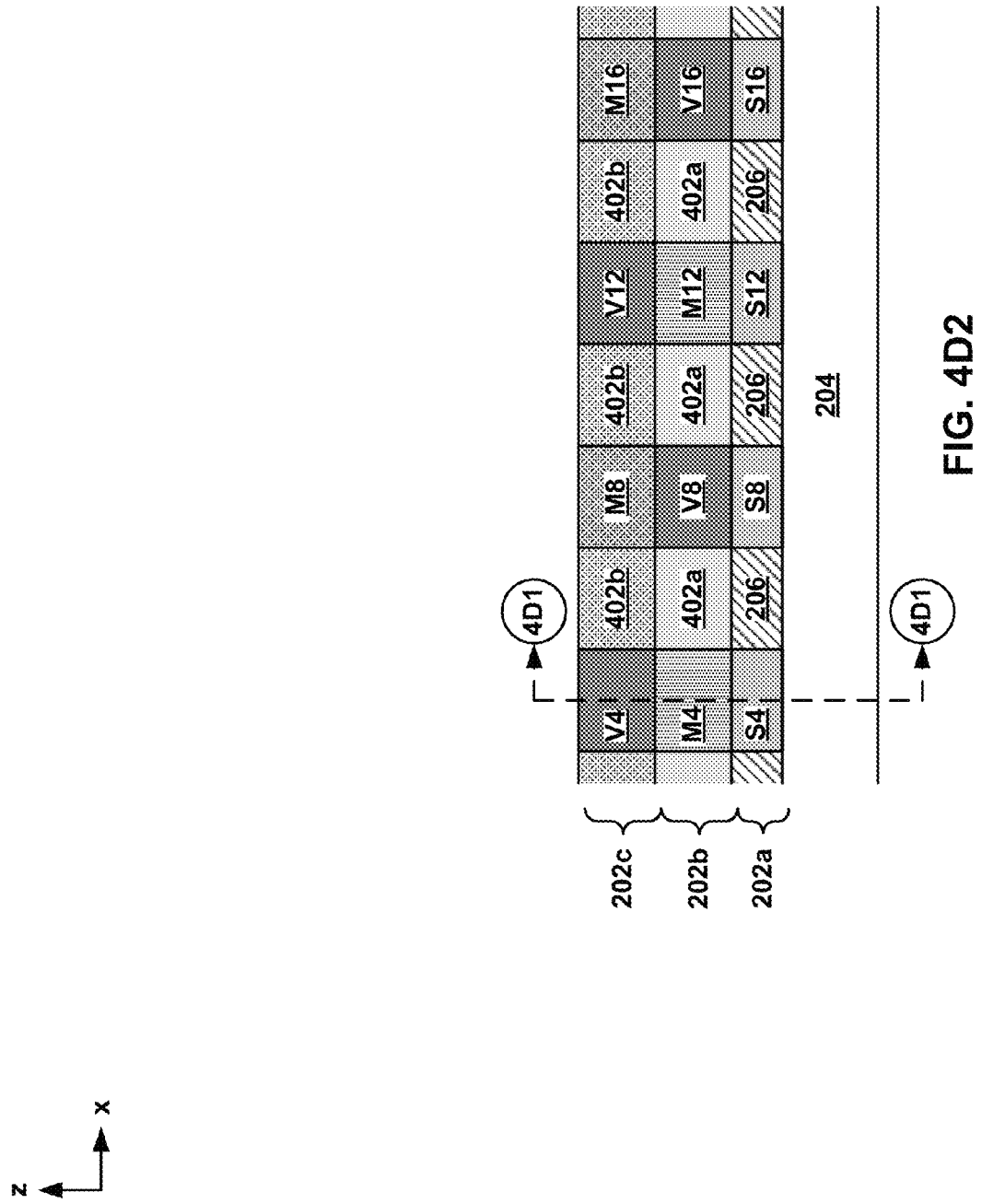
FIG. 4D2

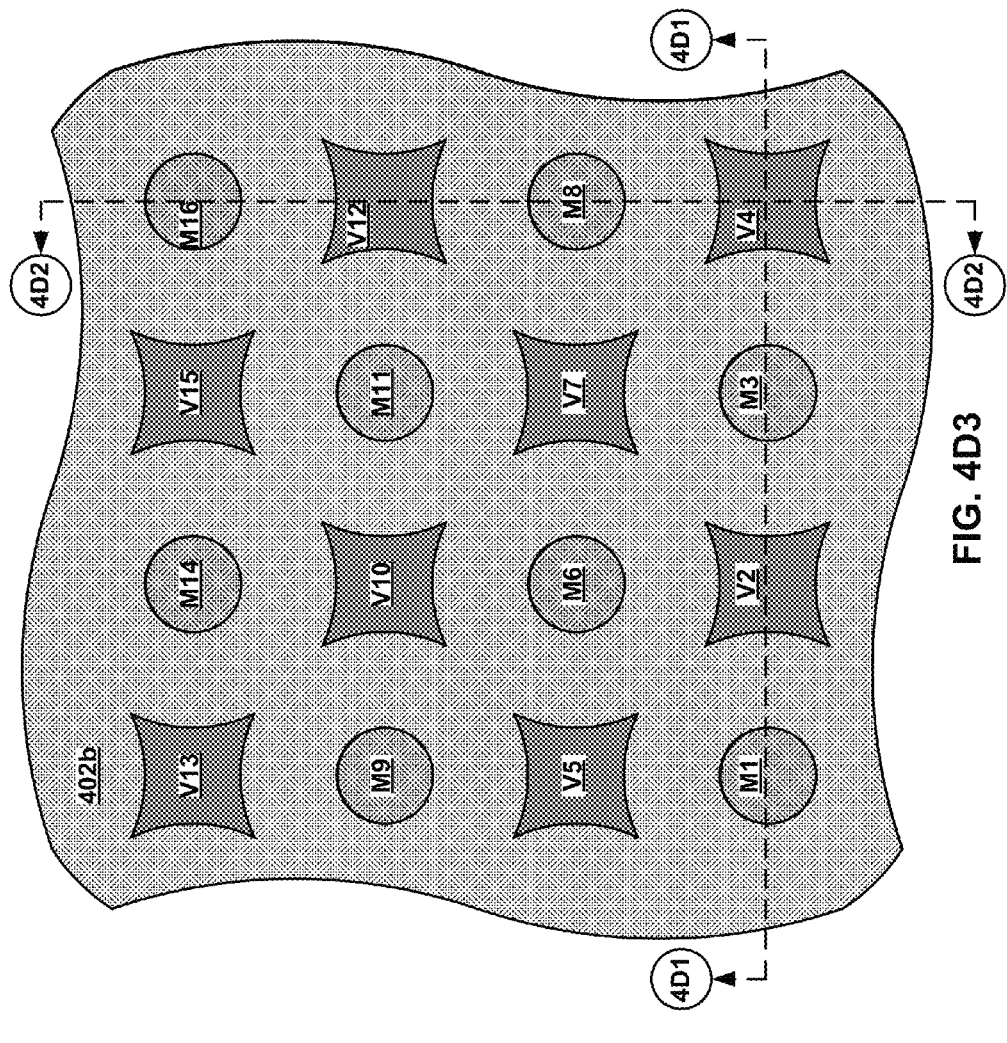
FIG. 4D3

US 9,941,331 B1

DEVICE WITH SUB-MINIMUM PITCH AND METHOD OF MAKING

BACKGROUND

This application relates to technology for fabricating semiconductor devices having sub-minimum pitch.

In semiconductor processing, the term "pitch" typically refers to a center-to-center spacing between identical features in a semiconductor device, and a minimum pitch is the smallest allowable center-to-center spacing between identical features. Some semiconductor devices require several processes, each having a minimum pitch. For example, a semiconductor device may require a first process having a first minimum pitch P1, and a second process having a second minimum pitch P2. In such instances, the entire device usually has to be manufactured at the largest minimum pitch required by the various constituent processes. In the example described above, if P2>P1, the entire device usually has to be manufactured at the second minimum pitch P2. In these cases, the scaling (and thus cost reduction) of the device is limited by this worst-case process.

An example is a monolithic three-dimensional semiconductor device that includes a magnetoresistive random access memory (MRAM) cell array built above an underlying array of vertically-oriented selectors, such as vertically-oriented transistors or two-terminal selector devices. The underlying selector array can be scaled to pitches limited only by industry-standard patterning techniques (e.g., immersion 193 nm lithography, double patterning, reactive ion etching, etc.), which can currently achieve pitches down to about 30 nm. However, typical MRAM materials cannot be patterned with such minimum pitch techniques, and currently use techniques that limit their pitch to about 65 nm. As a result, the entire monolithic three-dimensional semiconductor device has to be manufactured at the larger pitch required by the MRAM process.

BRIEF DESCRIPTION OF THE DRAWINGS

FIGS. 2A-2E depict various views of depict various views of an embodiment monolithic three-dimensional semiconductor device.

FIGS. 3A1-3I3 are cross-sectional views of a portion of a substrate during an example fabrication of the device of FIGS. 2A-2E.

FIGS. 4A1-4D3 are cross-sectional views of a portion of a substrate during another example fabrication of the device of FIGS. 2A-2E.

DETAILED DESCRIPTION

Figure 1A:
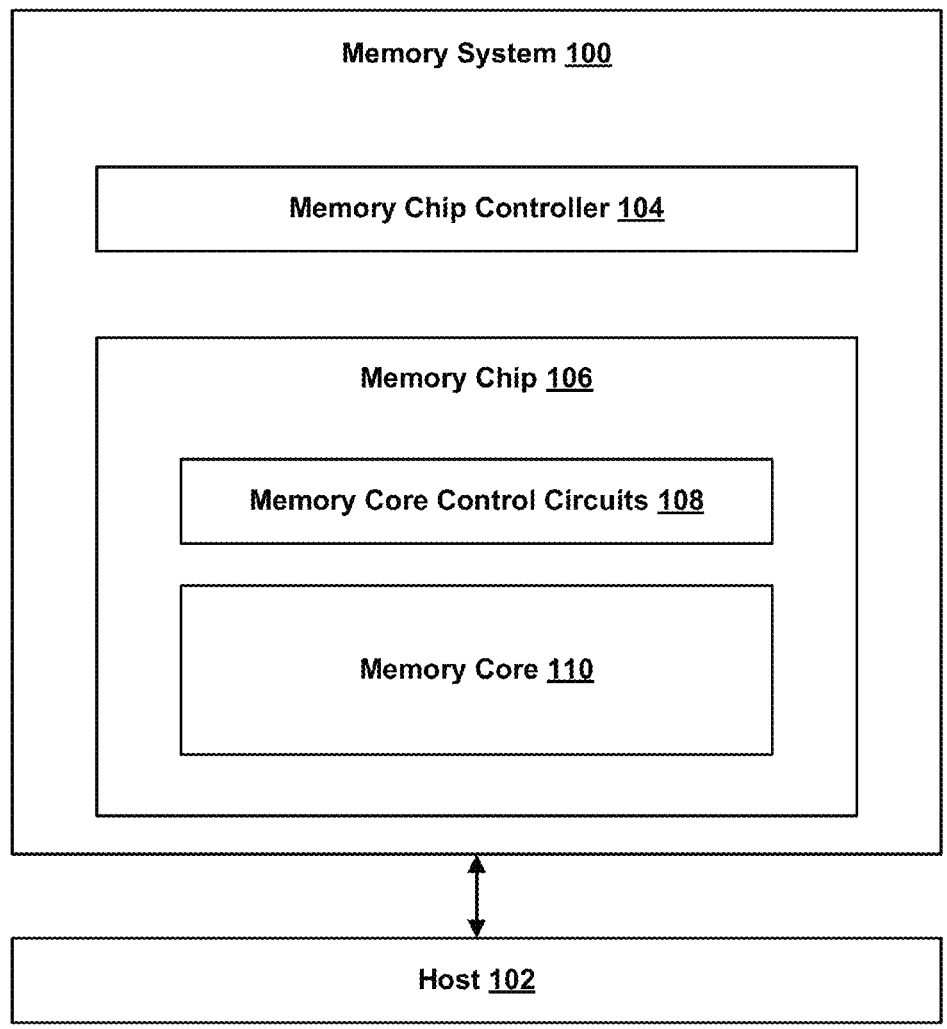
FIG. 1A depicts an embodiment of a memory system and a host.

Technology is described for forming monolithic three-dimensional semiconductor devices, such as monolithic three-dimensional nonvolatile memory arrays. In particular, technology is described for forming monolithic three-dimensional devices by forming a first level above a substrate, forming a second level above the first level, and forming a third level above the second level. The first level includes a plurality of first elements having a first minimum pitch, the second level includes a plurality of second elements having a second minimum pitch greater than the first minimum pitch, and the third level includes a plurality of third elements having a third minimum pitch greater than the first minimum pitch. The second elements are disposed above and aligned with a first plurality of the first elements, and the third elements are disposed above and aligned with a second plurality of the first elements.

In an embodiment, the second elements and the third elements are the same type of element, and the second minimum pitch equals the first minimum pitch. In this regard, the second and third elements are staggered vertically on the second and third level, and the effective pitch of the second and third elements can be substantially matched to the first minimum pitch of the first elements, below the minimum pitch of the second and third elements.

In some embodiments, a memory array may include a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a reversible resistance-switching memory element or an MRAM memory element disposed between first and second conductors. Example reversible resistance-switching memory elements include a phase change material, a ferroelectric material, a metal oxide (e.g., hafnium oxide), a barrier modulated switching structure, or other similar reversible resistance-switching memory elements.

In some cases, each memory cell in a cross-point memory array includes a reversible resistance-switching memory element or an MRAM memory element in series with a steering element or an isolation element, such as a diode, to reduce leakage currents. In other cross-point memory arrays, the memory cells do not include an isolation element.

In an embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates.

In some cases, a three-dimensional memory array may include one or more vertical columns of memory cells located above and orthogonal to a substrate. In an example, a non-volatile storage system may include a memory array with vertical bit lines or bit lines that are arranged orthogonal to a semiconductor substrate. The substrate may include a silicon substrate. The memory array may include rewriteable non-volatile memory cells, wherein each memory cell includes a reversible resistance-switching memory element without an isolation element in series with the reversible resistance-switching memory element (e.g., no diode in series with the reversible resistance-switching memory element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, and/or control circuitry for controlling reading, programming and erasing of the memory cells). The circuitry associated with the operation of the memory cells may be located above the substrate or within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 100 and a host 102. Memory system 100 may include a non-volatile storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, programming, and reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, and generating row and column addresses.

Memory core 110 may include one or more two-dimensional arrays of memory cells or one or more three-dimensional arrays of memory cells. In an embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 will send to memory chip controller 104 both a write command and the data to be written. The data to be written may be buffered by memory chip controller 104 and error correcting code (ECC) data may be generated corresponding with the data to be written. The ECC data, which allows data errors that occur during transmission or storage to be detected and/or corrected, may be written to memory core 110 or stored in non-volatile memory within memory chip controller 104. In an embodiment, the ECC data are generated and data errors are corrected by circuitry within memory chip controller 104.

Memory chip controller 104 controls operation of memory chip 106. In one example, before issuing a write operation to memory chip 106, memory chip controller 104 may check a status register to make sure that memory chip 106 is able to accept the data to be written. In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested. Once a read or write operation is initiated by memory chip controller 104, memory core control circuits 108 may generate the appropriate bias voltages for word lines and bit lines within memory core 110, and generate the appropriate memory block, row, and column addresses.

In some embodiments, one or more managing or control circuits may be used for controlling the operation of a memory array. The one or more managing or control circuits may provide control signals to a memory array to perform an erase operation, a read operation, and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may include an on-chip memory controller for determining row and column address, word line and bit line addresses, memory array enable signals, and data latching signals.

Figure 1B:
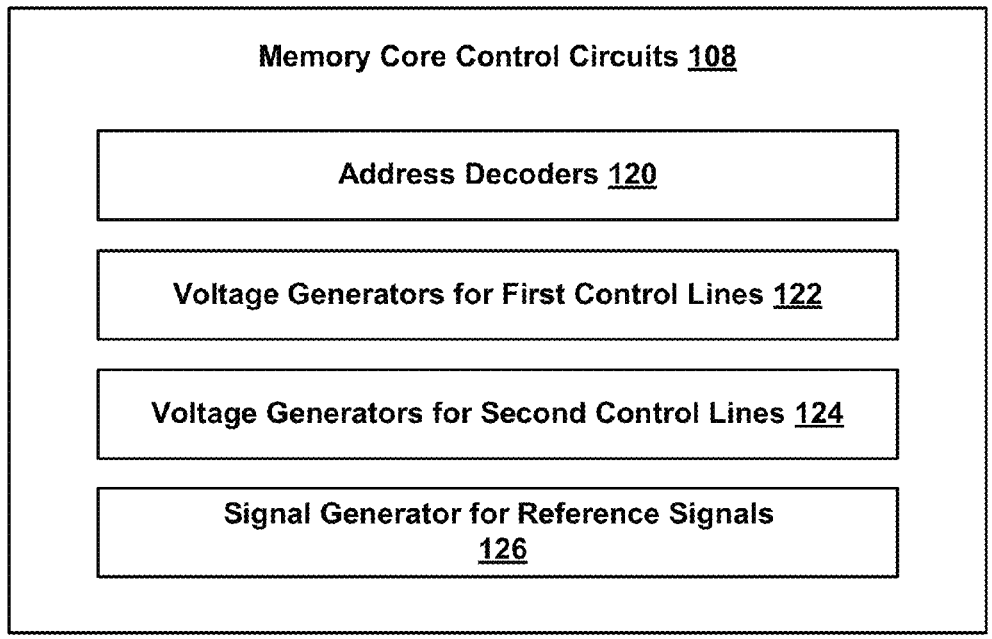
FIG. 1B depicts an embodiment of memory core control circuits.

FIG. 1B depicts one embodiment of memory core control circuits 108. As depicted, memory core control circuits 108 include address decoders 120, voltage generators for first control lines 122, voltage generators for second control lines 124 and signal generators for reference signals 126 (described in more detail below). Control lines may include word lines, bit lines, or a combination of word lines and bit lines. First control lines may include first (e.g., selected) word lines and/or first (e.g., selected) bit lines that are used to place memory cells into a first (e.g., selected) state. Second control lines may include second (e.g., unselected) word lines and/or second (e.g., unselected) bit lines that are used to place memory cells into a second (e.g., unselected) state.

Address decoders 120 may generate memory block addresses, as well as row addresses and column addresses for a particular memory block. Voltage generators (or voltage regulators) for first control lines 122 may include one or more voltage generators for generating first (e.g., selected)

control line voltages. Voltage generators for second control lines 124 may include one or more voltage generators for generating second (e.g., unselected) control line voltages. Signal generators for reference signals 126 may include one or more voltage and/or current generators for generating reference voltage and/or current signals.

FIGS. 1C-1F depict one embodiment of a memory core organization that includes a memory core having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
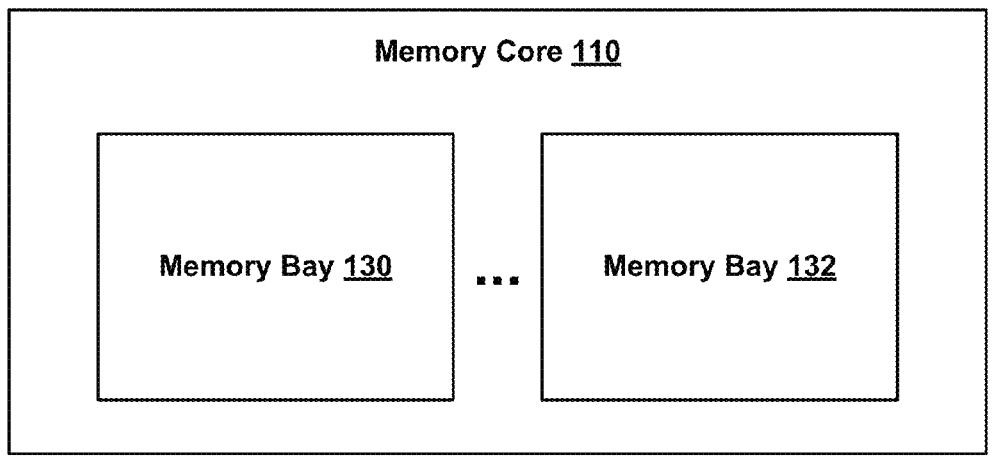
FIG. 1C depicts an embodiment of a memory core.

FIG. 1C depicts an embodiment of memory core 110 of FIG. 1A. As depicted, memory core 110 includes memory bay 130 and memory bay 132. In some embodiments, the number of memory bays per memory core can differ for different implementations. For example, a memory core may include only a single memory bay or multiple memory bays (e.g., 16 or other number of memory bays).

Figure 1D:
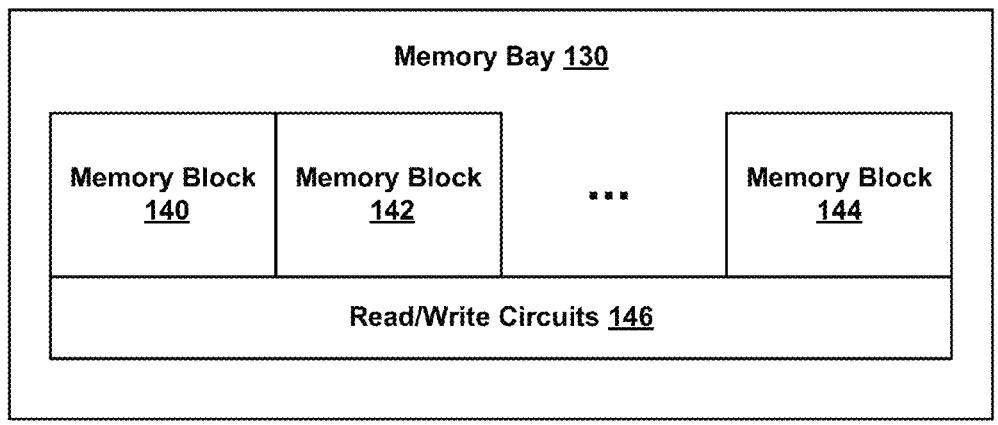
FIG. 1D depicts an embodiment of a memory bay.

FIG. 1D depicts an embodiment of memory bay 130 in FIG. 1C. As depicted, memory bay 130 includes memory blocks 140-144 and read/write circuits 146. In some embodiments, the number of memory blocks per memory bay may differ for different implementations. For example, a memory bay may include one or more memory blocks (e.g., 32 or other number of memory blocks per memory bay). Read/write circuits 146 include circuitry for reading and writing memory cells within memory blocks 140-144.

As depicted, read/write circuits 146 may be shared across multiple memory blocks within a memory bay. This allows chip area to be reduced because a single group of read/write circuits 146 may be used to support multiple memory blocks. However, in some embodiments, only a single memory block may be electrically coupled to read/write circuits 146 at a particular time to avoid signal conflicts.

In some embodiments, read/write circuits 146 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In one example, memory system 100 of FIG. 1A may receive a write command including a target address and a set of data to be written to the target address. Memory system 100 may perform a read-before-write (RBW) operation to read the data currently stored at the target address and/or to acquire overhead information (e.g., ECC information) before performing a write operation to write the set of data to the target address.

In some cases, read/write circuits 146 may be used to program a particular memory cell to be in one of three or more data/resistance states (i.e., the particular memory cell may include a multi-level memory cell). In one example, read/write circuits 146 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states.

Applying a smaller voltage difference across the particular memory cell may cause the particular memory cell to be partially programmed or programmed at a slower rate than when applying a larger voltage difference. In another example, read/write circuits 146 may apply a first voltage difference across the particular memory cell for a first time period to program the particular memory cell into a first state of the three or more data/resistance states, and apply the first voltage difference across the particular memory cell for a second time period less than the first time period. One or more programming pulses followed by a memory cell verification phase may be used to program the particular memory cell to be in the correct state.

Figure 1E:
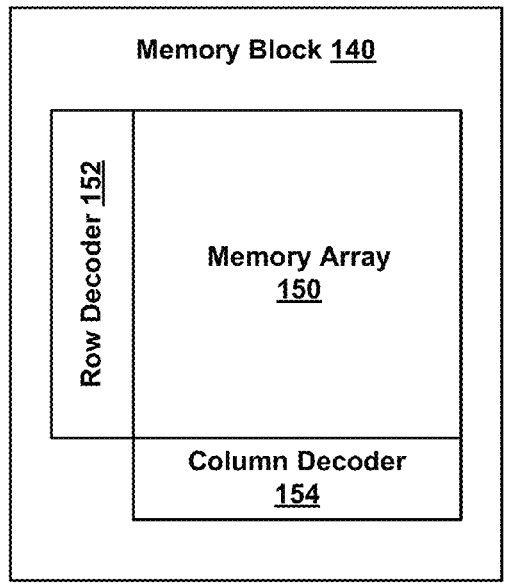
FIG. 1E depicts an embodiment of a memory block.

FIG. 1E depicts an embodiment of memory block 140 in FIG. 1D. As depicted, memory block 140 includes a memory array 150, row decoder 152, and column decoder 154. Memory array 150 may include a contiguous group of memory cells having contiguous word lines and bit lines. Memory array 150 may include one or more layers of memory cells. Memory array 150 may include a two-dimensional memory array or a three-dimensional memory array.

Row decoder 152 decodes a row address and selects a particular word line in memory array 150 when appropriate (e.g., when reading or writing memory cells in memory array 150). Column decoder 154 decodes a column address and selects one or more bit lines in memory array 150 to be electrically coupled to read/write circuits, such as read/write circuits 146 in FIG. 1D. In one embodiment, the number of word lines is 4K per memory layer, the number of bit lines is 1K per memory layer, and the number of memory layers is 4, providing a memory array 150 containing 16M memory cells.

Figure 1F:
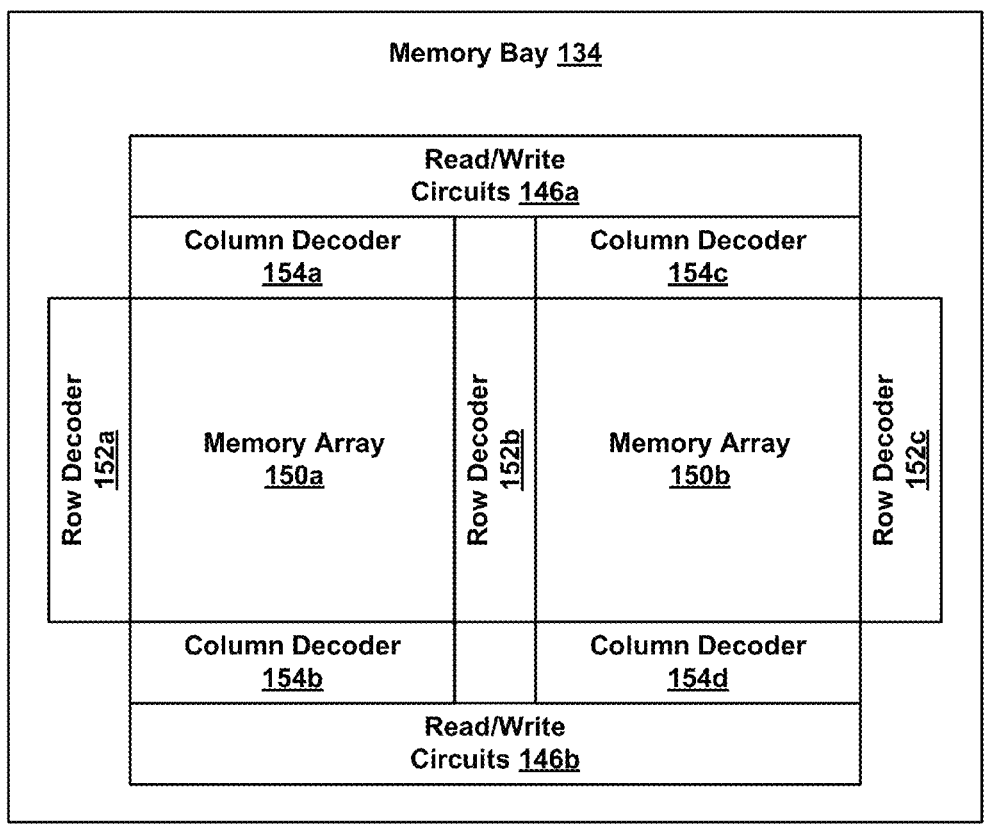
FIG. 1F depicts another embodiment of a memory bay.

FIG. 1F depicts an embodiment of a memory bay 134. Memory bay 134 is an alternative example implementation for memory bay 130 of FIG. 1D. In some embodiments, row decoders, column decoders, and read/write circuits may be split or shared between memory arrays. As depicted, row decoder 152b is shared between memory arrays 150a and 150b because row decoder 152b controls word lines in both memory arrays 150a and 150b (i.e., the word lines driven by row decoder 152b are shared).

Row decoders 152a and 152b may be split such that even word lines in memory array 150a are driven by row decoder 152a and odd word lines in memory array 150a are driven by row decoder 152b. Row decoders 152c and 152b may be split such that even word lines in memory array 150b are driven by row decoder 152c and odd word lines in memory array 150b are driven by row decoder 152b.

Column decoders 154a and 154b may be split such that even bit lines in memory array 150a are controlled by column decoder 154b and odd bit lines in memory array 150a are driven by column decoder 154a. Column decoders 154c and 154d may be split such that even bit lines in memory array 150b are controlled by column decoder 154d and odd bit lines in memory array 150b are driven by column decoder 154c.

The selected bit lines controlled by column decoder 154a and column decoder 154c may be electrically coupled to read/write circuits 146a. The selected bit lines controlled by column decoder 154b and column decoder 154d may be electrically coupled to read/write circuits 146b. Splitting the read/write circuits into read/write circuits 146a and 146b when the column decoders are split may allow for a more efficient layout of the memory bay.

FIGS. 2A-2E depict various views of an example monolithic three-dimensional semiconductor device 200 that includes a first level 202a, a second level 202b, and a third level 202c disposed above a substrate 204. Monolithic three-dimensional semiconductor device 200 may be any type of semiconductor device. In an embodiment, monolithic three-dimensional semiconductor device 200 is an example of a portion of memory array 150 of FIG. 1E.

Referring again to FIGS. 2A-2E, first level 202a is disposed above substrate 204, second level 202b is disposed above first level 202a, and third level 202c is disposed above second level 202b. Each of first level 202a, second level 202b, and third level 202c has a corresponding minimum pitch, P1, P2, P3, respectively. Although three levels 202a, 202b, 202c are depicted in FIGS. 2A-2E, more than three levels may be used.

As described above, minimum pitch is a minimum center-to-center spacing between identical features. For example, if first level 202a includes vertical pillar diodes, minimum pitch P1 for first level 202a may specify a minimum center-to-center spacing between vertical pillar diodes on first level 202a. If second level 202b includes MRAM cells, minimum pitch P2 may specify a minimum center-to-center spacing between MRAM cells on second level 202b. If third level 202c also includes MRAM cells, minimum pitch P3 may specify a minimum center-to-center spacing between MRAM cells on third level 202c. Persons of ordinary skill in the art will understand that a material layer may include more than one type of feature, and therefore may include more than one minimum pitch.

In an embodiment, first level 202a includes first elements S1, S2, S3, . . . S16 disposed above substrate 204. Substrate 204 may be a silicon, germanium, silicon-germanium, undoped, doped, bulk, silicon-on-insulator ("SOI") or other substrate with or without additional circuitry.

In an embodiment, first elements S1, S2, S3, . . . S16 are separated from one another by a first dielectric material layer 206 (e.g., silicon dioxide), and have first minimum pitch P1. In an embodiment, first minimum pitch P1 is between about 30 nm and about 300 nm, although other values may be used. Persons of ordinary skill in the art will understand that first level 202a may include more or fewer than sixteen first elements S1, S2, S3, . . . S16.

In an embodiment, first elements S1, S2, S3, . . . S16 are vertical pillar-shaped selector devices (e.g., vertical pillar diodes, vertical transistors, or other selector devices) arranged in a first direction (e.g., an x-direction) and a second direction (e.g., a y-direction), with each first element S1, S2, S3, . . . S16 extending in a third direction (e.g., a z-direction) above substrate 204. In an embodiment, each first element S1, S2, S3, . . . S16 is a pillar having a rectangular shape, although other shapes may be used.

Each first element S1, S2, S3, . . . S16 may include a single layer of material, or may include multiple layers of material. In an embodiment, each first element S1, S2, S3, . . . S16 is a vertical selector, such as vertical diode, a vertical thin film transistor, a threshold selector such as a volatile conductive bridge or a Ovonyx threshold switch, or other similar selector device. First elements S1, S2, S3, . . . S16 may be other types of devices.

In an embodiment, second level 202b includes second elements M2, M4, M5, M7, M10, M12, M13, M15 and first vias V1, V3, V6, V8, V9, V11, V14, V16. Persons of ordinary skill in the art will understand that second level 202b may include more or fewer than eight second elements M2, M4, M5, M7, M10, M12, M13, M15 and more or fewer than eight first vias V1, V3, V6, V8, V9, V11, V14, V16.

In an embodiment, second elements M2, M4, M5, M7, M10, M12, M13, M15 are separated from one another and from first vias V1, V3, V6, V8, V9, V11, V14, V16 by a second dielectric material 210 (e.g., silicon dioxide). In an embodiment, second elements M2, M4, M5, M7, M10, M12, M13, M15 have second minimum pitch P2, and first vias V1, V3, V6, V8, V9, V11, V14, V16 also have second minimum pitch P2. In an embodiment second minimum pitch P2 is greater than first minimum pitch P1. In an embodiment, second minimum pitch $P2=\sqrt{2}\times P1$. In an embodiment, second minimum pitch P2 is between about 42 nm and about 420 nm, although other values may be used.

In an embodiment, second elements M2, M4, M5, M7, M10, M12, M13, M15 are memory cells (e.g., MRAM memory elements, or other memory cells) arranged in the first direction (e.g., an x-direction) and the second direction (e.g., a y-direction). In an embodiment, each second element M2, M4, M5, M7, M10, M12, M13, M15 is a vertical pillar-shaped memory cell having a circular shape, although other shapes may be used. In an embodiment, first vias V1, V3, V6, V8, V9, V11, V14, V16 are arranged in the first direction (e.g., an x-direction) and the second direction (e.g., a y-direction). In an embodiment, each first via V1, V3, V6, V8, V9, V11, V14, V16 is a vertical pillar having a circular shape, although other shapes may be used.

In an embodiment, second elements M2, M4, M5, M7, M10, M12, M13, M15 are disposed above and aligned with a first group of first elements S1, S2, S3, . . . S16, and first vias V1, V3, V6, V8, V9, V11, V14, V16 are disposed above and aligned with a second group of first elements S1, S2, S3, . . . S16. In an embodiment, the first group of first elements is S2, S4, S5, S7, S10, S12, S13, S15 (that is, every other first element in the first and second directions), and the second group of first elements is S1, S3, S6, S8, S9, S11, S14, S16 (that is, a remaining every other first element in the first and second directions). In an embodiment, second elements M2, M4, M5, M7, M10, M12, M13, M15 are disposed above and aligned with first elements S2, S4, S5, S7, S10, S12, S13, S15, respectively, and first vias V1, V3, V6, V8, V9, V11, V14, V16 are disposed above and aligned with first elements S1, S3, S6, S8, S9, S11, S14, S16, respectively.

In an embodiment, each second element M2, M4, M5, M7, M10, M12, M13, M15 may include a single layer of material, or may include multiple layers of material. In an embodiment, each second element M2, M4, M5, M7, M10, M12, M13, M15 includes a stack of one or more MRAM material layers, although other materials may be used. Each first via V1, V3, V6, V8, V9, V11, V14, V16 may include a single layer of material, or may include multiple layers of material. In an embodiment, each first via V1, V3, V6, V8, V9, V11, V14, V16 includes a conductive material (e.g., tungsten, titanium nitride, or other conductive material).

In an embodiment, third level 202c includes third elements M1, M3, M6, M8, M9, M11, M14, M16 and second vias V2, V4, V5, V7, V10, V12, V13, V15. Persons of ordinary skill in the art will understand that third level 202c may include more or fewer than eight third elements M1, M3, M6, M8, M9, M11, M14, M16 and more or fewer than eight second vias V2, V4, V5, V7, V10, V12, V13, V15.

In an embodiment, third elements M1, M3, M6, M8, M9, M11, M14, M16 are separated from one another and from second vias V2, V4, V5, V7, V10, V12, V13, V15 by a third dielectric material 212 (e.g., silicon dioxide). In an embodiment, third elements M1, M3, M6, M8, M9, M11, M14, M16 have third minimum pitch P3, and second vias V2, V4, V5, V7, V10, V12, V13, V15 also have third minimum pitch P3. In an embodiment third minimum pitch P3 is greater than first minimum pitch P1. In an embodiment, P3=P2=

√2×P1. In an embodiment, third minimum pitch P3 is between about 42 nm and about 420 nm, although other values may be used.

In an embodiment, third elements M1, M3, M6, M8, M9, M11, M14, M16 are (e.g., MRAM memory elements, or other memory cells) arranged in the first direction (e.g., an x-direction) and the second direction (e.g., a y-direction). In an embodiment, each third element M1, M3, M6, M8, M9, M11, M14, M16 is a vertical pillar-shaped memory cell having a circular shape, although other shapes may be used. In an embodiment, second vias V2, V4, V5, V7, V10, V12, V13, V15 are arranged in the first direction (e.g., an x-direction) and the second direction (e.g., a y-direction). In an embodiment, each second via V2, V4, V5, V7, V10, V12, V13, V15 is a vertical pillar having a circular shape, although other shapes may be used.

In an embodiment, third elements M1, M3, M6, M8, M9, M11, M14, M16 are disposed above and aligned with the second group of first elements S1, S2, S3, . . . S16, and second vias V2, V4, V5, V7, V10, V12, V13, V15 are disposed above and aligned with the first group of first elements S1, S2, S3, . . . S16. In an embodiment, the first group of first elements is S2, S4, S5, S7, S10, S12, S13, S15 (that is, every other first element in the first and second directions), and the second group of first elements is S, S3, S6, S8, S9, S11, S14, S16 (that is, the remaining every other first element in the first and second directions). In an embodiment, third elements M1, M3, M6, M8, M9, M11, M14, M16 are disposed above and aligned with first elements S1, S3, S6, S8, S9, S11, S14, S16, respectively, and second vias V2, V4, V5, V7, V10, V12, V13, V15 are disposed above and aligned with first elements S2, S4, S5, S7, S10, S12, S13, S15, respectively.

In an embodiment, each third element M1, M3, M6, M8, M9, M11, M14, M16 may include a single layer of material, or may include multiple layers of material. In an embodiment, each third element M1, M3, M6, M8, M9, M11, M14, M16 includes a stack of one or more MRAM material layers, although other materials may be used. Each second via V2, V4, V5, V7, V10, V12, V13, V15 may include a single layer of material, or may include multiple layers of material. In an embodiment, each second via V2, V4, V5, V7, V10, V12, V13, V15 includes a conductive material (e.g., tungsten, titanium nitride, or other conductive material).

In an embodiment, second elements M2, M4, M5, M7, M10, M12, M13, M15 and third elements M1, M3, M6, M8, M9, M11, M14, M16 are the same type of element (e.g., MRAM elements), and collectively form a set of sixteen elements M1, M2, M3, . . . M16 variously disposed on second level 202b and third level 202c. In other embodiments, elements M1, M2, M3, . . . M16 may be variously disposed on more than two material layers. In still other embodiments, second elements M2, M4, M5, M7, M10, M12, M13, M15 may be different type of elements than third elements M1, M3, M6, M8, M9, M11, M14, M16, but may share a common minimum pitch (e.g., P2=P3).

Thus, as depicted in FIGS. 2A-2E, third elements M1, M3, M6, M8, M9, M11, M14, M16 are vertically disposed above and aligned with first vias V1, V3, V6, V8, V9, V11, V14, V16, respectively, which in turn are disposed above and aligned with first elements S1, S3, S6, S8, S9, S11, S14, S16, respectively. In an embodiment, third elements M1, M3, M6, M8, M9, M11, M14, M16 are MRAM cells, first elements S1, S3, S6, S8, S9, S11, S14, S16 are selector devices, and first vias V1, V3, V6, V8, V9, V11, V14, V16 are conductive vias that conductively couple MRAM elements M1, M3, M6, M8, M9, M11, M14, M16, respectively to selector devices S1, S3, S6, S8, S9, S11, S14, S16, respectively.

In addition, as depicted in FIGS. 2A-2E, second vias V2, V4, V5, V7, V10, V12, V13, V15 are vertically disposed above and aligned with second elements M2, M4, M5, M7, M10, M12, M13, M15, respectively, which in turn are vertically disposed above and aligned with first elements S2, S4, S5, S7, S10, S12, S13, S15, respectively. In an embodiment, second elements M2, M4, M5, M7, M10, M12, M13, M15 are MRAM cells, first elements S2, S4, S5, S7, S10, S12, S13, S15 are selector devices conductively coupled to MRAM elements M2, M4, M5, M7, M10, M12, M13, M15, respectively, and second vias V2, V4, V5, V7, V10, V12, V13, V15 are conductive vias that conductively couple MRAM elements M2, M4, M5, M7, M10, M12, M13, M15, respectively, through third level 202c.

Thus, as depicted in FIGS. 2A-2E, MRAM elements M1, M2, M3, . . . M16 are staggered between two separate levels 202b and 202c of device 200 vertically disposed above selector devices S1, S2, S3, . . . S16 on level 202a, with MRAM elements on second level 202b aligned with and disposed above every other selector device S1, S2, S3, . . . S16, and MRAM elements on third level 202c aligned with and disposed above the remaining selector device S1, S2, S3, . . . S16.

Without wanting to be bound by any particular theory, it is believed that by staggering MRAM elements M1, M2, M3, . . . M16 vertically on second level 202b and third level 202c, such as described above, the effective pitch of MRAM elements M1, M2, M3, . . . M16 can be substantially matched to minimum pitch P1 of selector devices S1, S2, S3, . . . S16, respectively, thereby allowing selector devices S1, S2, S3, . . . S16 to be fabricated at a first minimum pitch P1 that is less than second minimum pitch P2 and third minimum pitch P3 of MRAM elements M1, M2, M3, . . . M16.

Figure 2A:
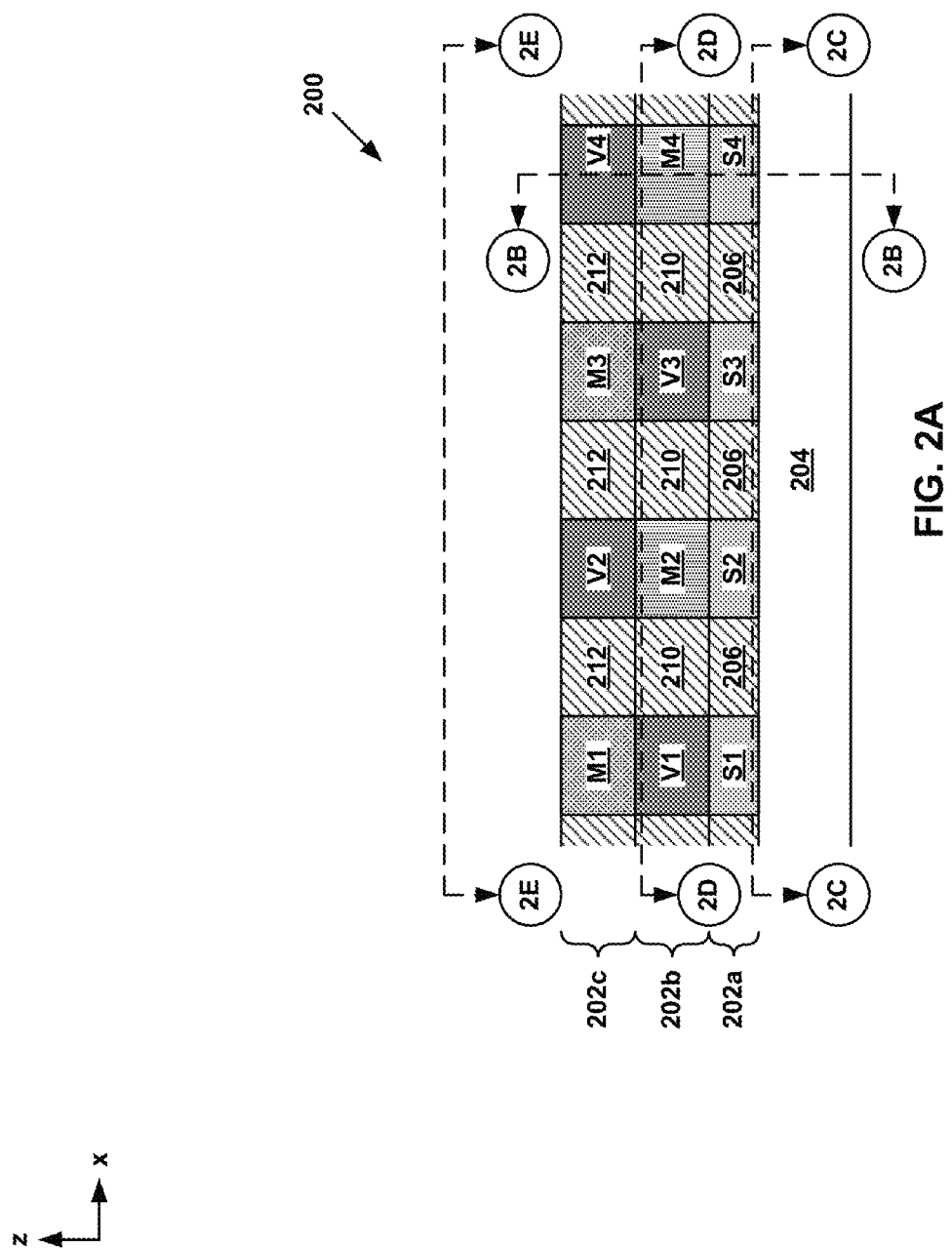
Figure 2C:
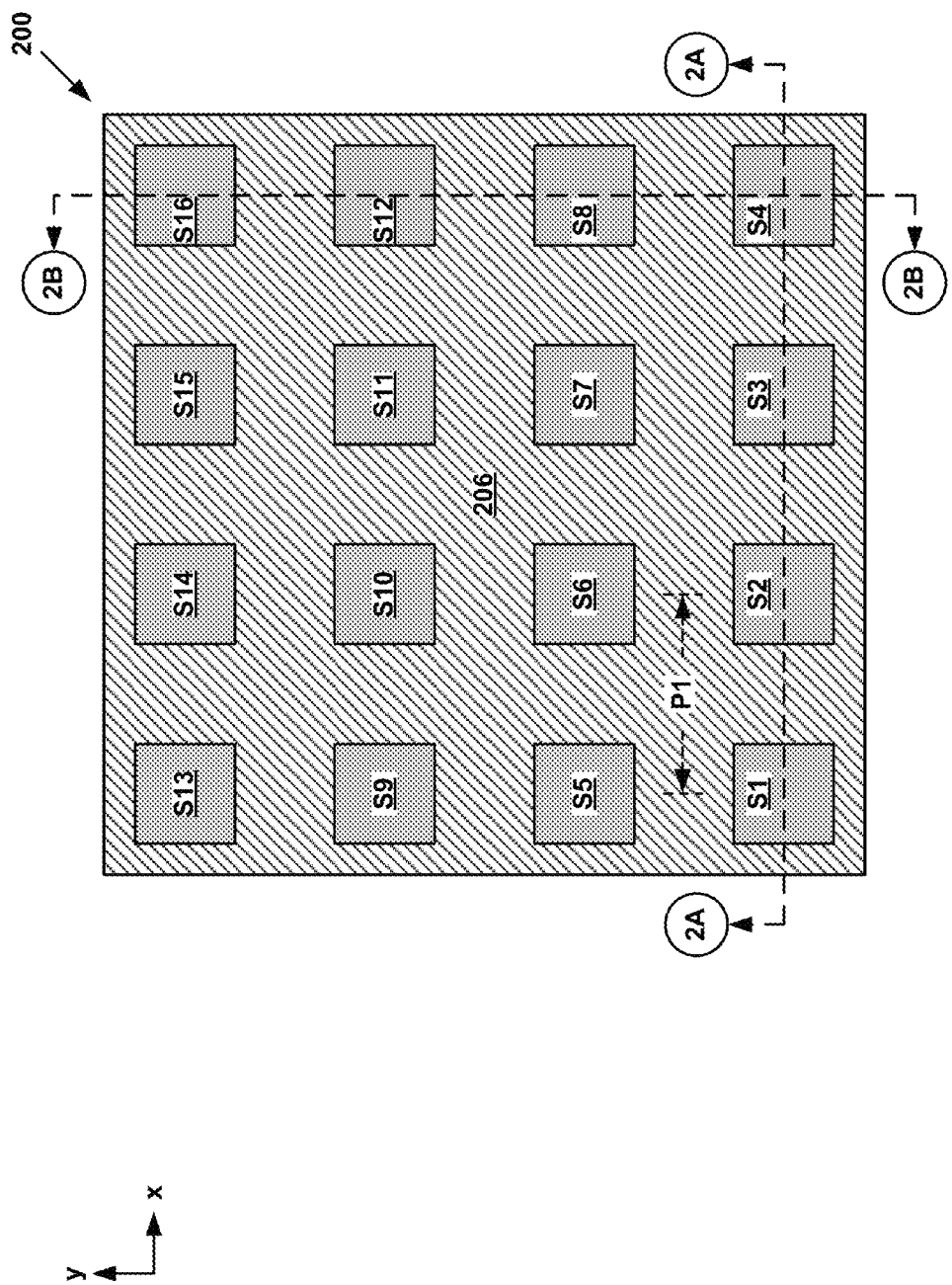
Figure 2D:
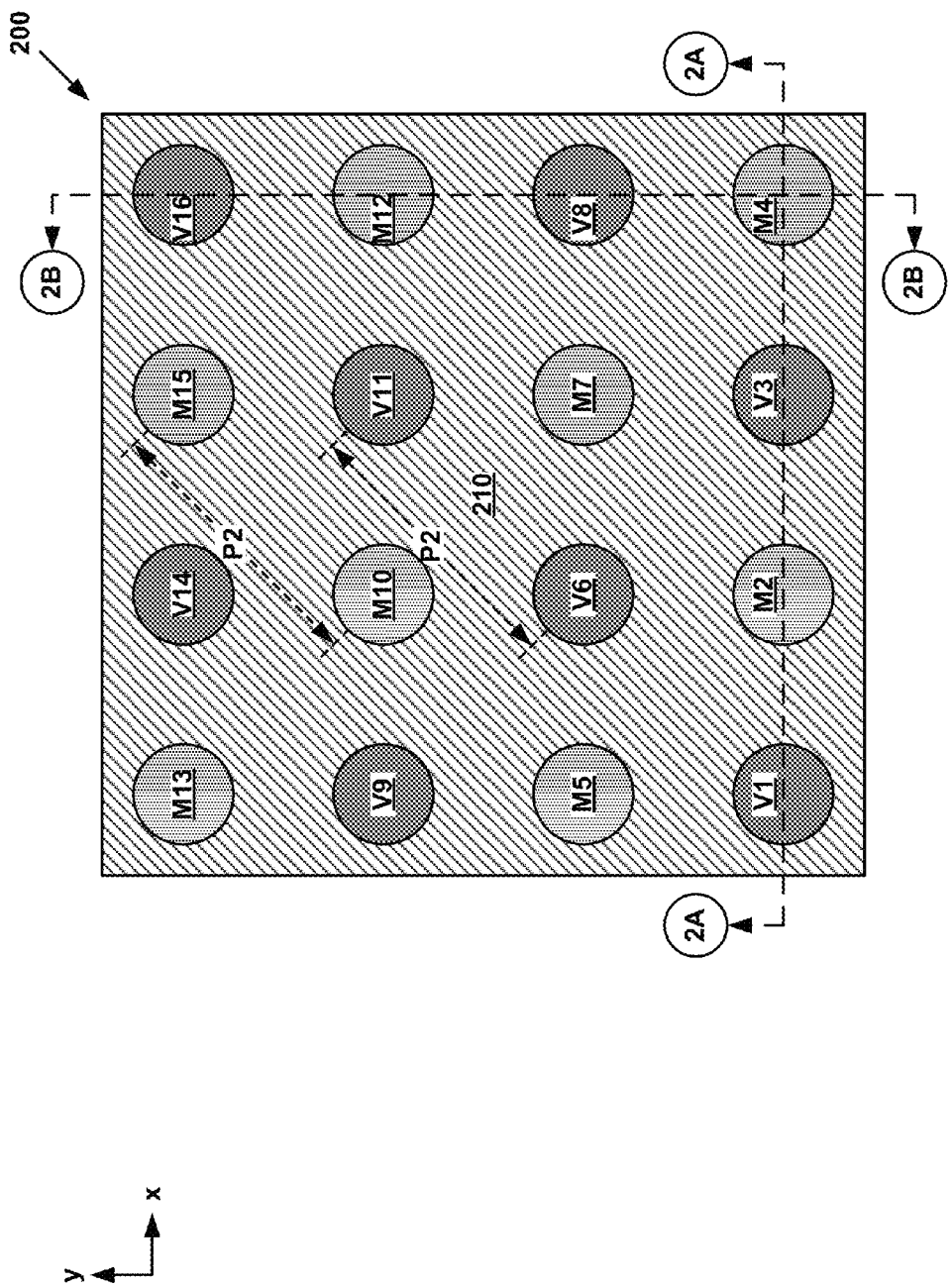
Figure 2E:
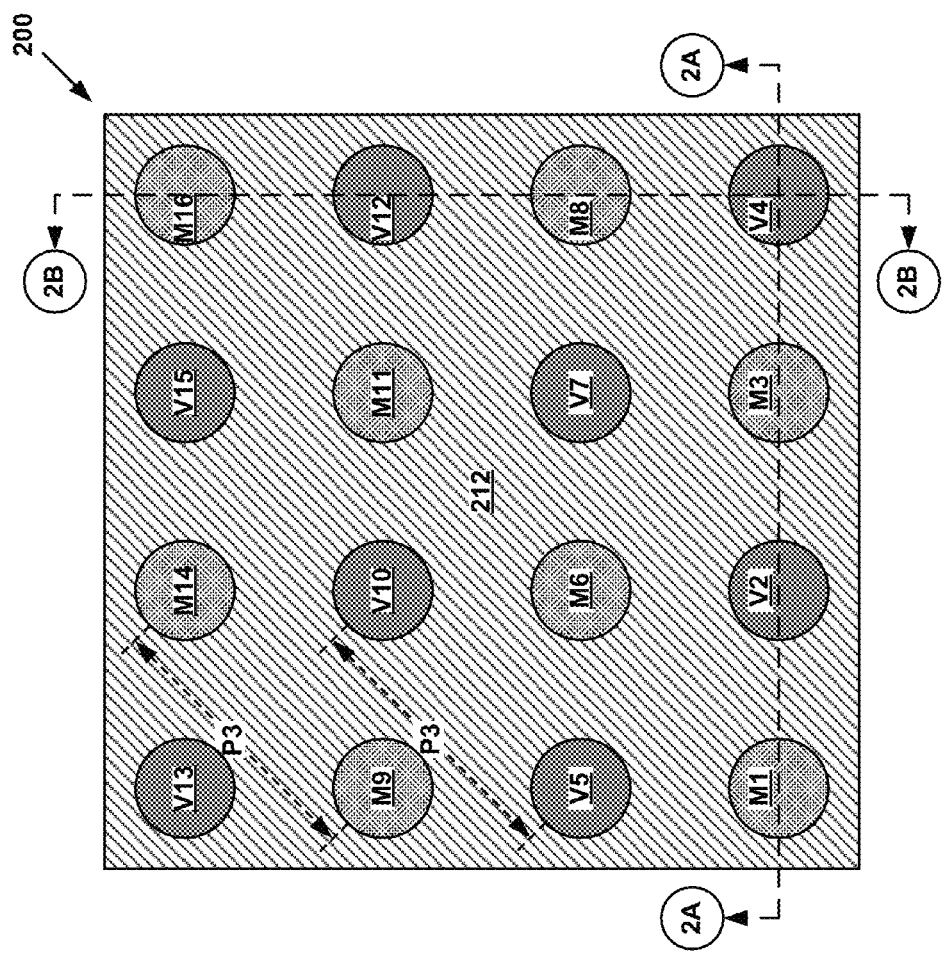
Figure 2F:
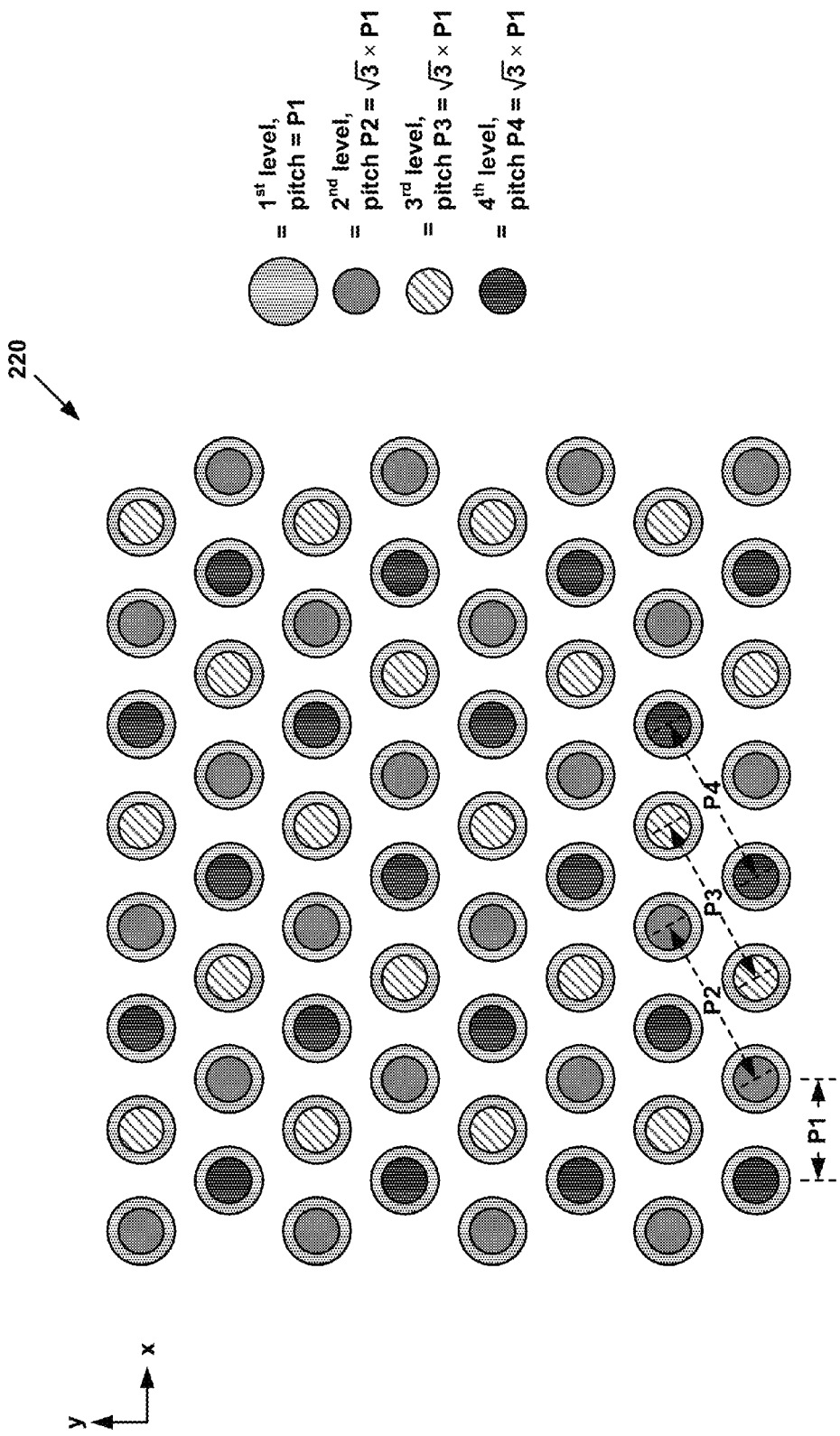
FIG. 2F depicts a top-level view of another embodiment monolithic three-dimensional semiconductor device.

Example monolithic three-dimensional semiconductor device 200 of FIGS. 2A-2E includes first level 202a, second level 202b, and third level 202c disposed above substrate 204. As described above, more than three levels may be disposed above substrate 204. FIG. 2F depicts a top-level view of another monolithic three-dimensional semiconductor device 220 that includes four levels disposed above a substrate.

In particular, elements on each of the first, second, third, and fourth levels are depicted with a circular cross-sectional shape, and are uniquely shaded to depict the elements on each level. Elements on the first level have a first pitch P1, whereas elements on the second level have a second pitch P2=√3×P1, elements on the third level have a third pitch P3=√3×P1, and elements on the fourth level have a fourth pitch P4=√3×P1. As depicted in FIG. 2F, elements on each of the second, third and fourth levels are disposed above and aligned with ⅓ of the elements on the first level, while vias are disposed above and aligned with the remaining ⅔ of the elements on the first level. In an embodiment, the vias on each of the second, third and fourth levels are patterned using multiple lithography steps.

Referring now to FIGS. 3A1-3I3, an example method is described for forming a monolithic three-dimensional semiconductor device, such as device 200 of FIGS. 2A-2E. With reference to FIGS. 3A1-3A3, substrate 204 is shown as having already undergone several processing steps. Substrate 204 may be any suitable substrate such as a silicon, germanium, silicon-germanium, undoped, doped, bulk, SOI or other substrate with or without additional circuitry. For example, substrate 204 may include one or more n-well or p-well regions (not shown). In some embodiments, an isolation layer (not shown) may be formed above substrate 204.

One or material layers are deposited over substrate 204 using any suitable method (e.g., CVD, PVD, or other method), and are then patterned and etched to form first elements S1, S2, S3, . . . S16. For example, the one or more material layers may be patterned and etched using conventional lithography techniques, with a soft or hard mask, and wet or dry etch processing. In an embodiment, the one or more material layers include material layers used to form vertical selectors, such as vertical diodes, vertical thin film transistors, threshold selectors such as volatile conductive bridges or Ovonyx threshold switches, or other similar selectors. Other materials may be used. In an embodiment, each first element S1, S2, S3, . . . S16 is a vertical pillar having a rectangular shape, although other shapes may be used.

In an embodiment, each first element S1, S2, S3, . . . S16 has a thickness between about 5 nm and about 500 nm, and has a width between about 15 nm and about 150 nm, although other thicknesses and widths may be used. In an embodiment, the spacing between adjacent first elements S1, S2, S3, . . . S16 is between about 15 nm and about 150 nm, although other spacing values may be used. First elements S1, S2, S3, . . . S16 have first minimum pitch P1. In an embodiment, first minimum pitch P1 is between about 30 nm and about 300 nm, although other values may be used.

After first elements S1, S2, S3, . . . S16 have been formed, a first dielectric material layer 206 is formed over substrate 204 to fill the voids between first elements S1, S2, S3, . . . S16. For example, approximately 300-700 nm of silicon dioxide may be deposited on the substrate 204 and planarized using chemical mechanical polishing or an etchback process to form a planar surface 302, completing first level 202a, and resulting in the structure shown in FIGS. 3A1-3A3. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In other embodiments, first elements S1, S2, S3, . . . S16 may be formed using a damascene process in which first dielectric material layer 206 is formed, patterned and etched to create openings or voids for first elements S1, S2, S3, . . . S16. The openings or voids then may be filled with the one or more material layers used to form first elements S1, S2, S3, . . . S16, and the one or more material layers may then be planarized to form planar surface 302.

Following planarization, a first material layer 304a is deposited over substrate 204, resulting in the structure shown in FIGS. 3B1-3B3. First material layer 304a may be a single material layer, or may one or more layers of one or more materials, deposited by any suitable method (e.g., CVD, PVD, or other method). In an embodiment, first material layer 304a may have a thickness between about 15 nm and about 150 nm, although other thicknesses may be used. In an embodiment, first material layer 304a includes a stack of two ferromagnetic material layers separated by an insulating material layer (not shown). Other materials may be used.

Following formation of first material layer 304a, first material layer 304a is patterned and etched to form second elements M2, M4, M5, M7, M10, M12, M13, M15. For example, first material layer 304a may be patterned and etched using conventional lithography techniques, with a soft or hard mask, and wet or dry etch processing. In an embodiment, second elements M2, M4, M5, M7, M10, M12, M13, M15 are vertically disposed above and aligned with first elements S2, S4, S5, S7, S10, S12, S13, S15, respectively. In an embodiment, each second element M2, M4, M5, M7, M10, M12, M13, M15 is a vertical pillar having a circular shape, although other shapes may be used.

In an embodiment, each second element M2, M4, M5, M7, M10, M12, M13, M15 has a diameter between about 5 nm and about 150 nm, although other diameters may be used. In an embodiment, the spacing between adjacent second elements M2, M4, M5, M7, M10, M12, M13, M15 is between about 2 nm and about 15 nm, although other spacing values may be used. Second elements M2, M4, M5, M7, M10, M12, M13, M15 have second minimum pitch P2. In an embodiment second minimum pitch P2 is greater than first minimum pitch P1. In an embodiment, second minimum pitch $P2=\sqrt{2}\times P1$. In an embodiment, second minimum pitch P2 is between about 42 nm and about 420 nm, although other values may be used.

A second dielectric material 210 is deposited over substrate 204. For example, approximately 500 nm to about 800 nm of silicon dioxide may be deposited and planarized using chemical mechanical polishing or an etch-back process to form planar top surface 306, resulting in the structure shown in FIGS. 3C1-3C3. Other dielectric materials and/or thicknesses may be used.

Next, second dielectric material 210 is patterned and etched to form first holes 308a disposed above every other first element S1, S2, S3, . . . S16. In an embodiment, first holes 308a have a circular shape and are disposed above and aligned with first elements S1, S3, S6, S8, S9, S11, S14, S16, resulting in the structure shown in FIGS. 3D1-3D3.

In an embodiment, each first hole 308a has a diameter between about 20 nm and about 150 nm, although other diameters may be used. In an embodiment, the spacing between adjacent first holes 308a is between about 20 nm and about 150 nm, although other spacing values may be used. First holes 308a have second minimum pitch P2.

After first holes 308a have been formed, a first conductive material is formed over substrate 204 to fill first holes 308a to form first vias V1, V3, V6, V8, V9, V11, V14, V16. For example, approximately 10 nm and about 200 nm of titanium nitride may be deposited on the substrate 204 and planarized using chemical mechanical polishing or an etch-back process to form a planar surface 310, completing second level 202b, and resulting in the structure shown in FIGS. 3E1-3E3. Other conductive materials and/or other conductive material layer thicknesses may be used. In an embodiment, first vias V1, V3, V6, V8, V9, V11, V14, V16 are disposed above and aligned with first elements S1, S3, S6, S8, S9, S11, S14, S16, respectively.

Following planarization, a second material layer 304b is deposited over substrate 204, resulting in the structure shown in FIGS. 3F1-3F3. Second material layer 304b may be a single material layer, or may one or more layers of one or more materials, deposited by any suitable method (e.g., CVD, PVD, or other method). In an embodiment, second material layer 304b may have a thickness between about 15 nm and about 150 nm, although other thicknesses may be used. In an embodiment, second material layer 304b includes a stack of two ferromagnetic material layers separated by an insulating material layer (not shown). Other materials may be used.

Following formation of second material layer 304b, second material layer 304b is patterned and etched to form third elements M1, M3, M6, M9, M9, M11, M14, M16. For example, second material layer 304b may be patterned and etched using conventional lithography techniques, with a soft or hard mask, and wet or dry etch processing. In an embodiment, third elements M1, M3, M6, M9, M9, M11, M14, M16 are vertically disposed above and aligned with first vias V1, V3, V6, V9, V9, V11, V14, V16, respectively. In an embodiment, each third element M1, M3, M6, M9, M9, M11, M14, M16 is a vertical pillar having a circular shape, although other shapes may be used.

In an embodiment, each third element M1, M3, M6, M9, M9, M11, M14, M16 has a diameter between about 5 nm and about 150 nm, although other diameters may be used. In an embodiment, the spacing between adjacent third elements M1, M3, M6, M9, M9, M11, M14, M16 is between about 2 nm and about 150 nm, although other spacing values may be used. Third elements M1, M3, M6, M9, M9, M11, M14, M16 have third minimum pitch P3. In an embodiment third minimum pitch P3 is greater than first minimum pitch P1. In an embodiment, third minimum pitch P3=second minimum pitch P2=$\sqrt{2}\times$P1. In an embodiment, third minimum pitch P3 is between about 42 nm and about 420 nm, although other values may be used.

A third dielectric material layer 212 is deposited over substrate 204. For example, approximately 500 nm to about 800 nm of silicon dioxide may be deposited and planarized using chemical mechanical polishing or an etch-back process to form planar top surface 312, resulting in the structure shown in FIGS. 3G1-3G3. Other dielectric materials and/or thicknesses may be used.

Next, third dielectric material 212 is patterned and etched to form second holes 308b disposed above every other first element S1, S2, S3, . . . S16. In an embodiment, second holes 308b have a circular shape and are disposed above and aligned with first elements S2, S4, S5, S7, S10, S12, S13, S15, resulting in the structure shown in FIGS. 3H1-3H3. Second holes 308b also are disposed above and aligned with second elements M2, M4, M5, M7, M10, M12, M13, M15.

In an embodiment, each second hole 308b has a diameter between about 20 nm and about 150 nm, although other diameters may be used. In an embodiment, the spacing between adjacent second holes 308b is between about 20 nm and about 150 nm, although other spacing values may be used. Second holes 308b have third minimum pitch P3.

After second holes 308b have been formed, a second conductive material is formed over substrate 204 to fill second holes 308b to form second vias V2, V4, V5, V7, V10, V12, V13, V15. For example, approximately 10 nm and about 200 nm of titanium nitride may be deposited on the substrate 204 and planarized using chemical mechanical polishing or an etchback process to form a planar surface 314, completing third level 202c, and resulting in the structure shown in FIGS. 3I1-3I3. Other conductive materials and/or other conductive material layer thicknesses may be used. In an embodiment, second vias V2, V4, V5, V7, V10, V12, V13, V15 are disposed above and aligned with second elements M2, M4, M5, M7, M10, M12, M13, M15, respectively, which are disposed above and aligned with first elements S2, S4, S5, S7, S10, S12, S13, S15, respectively.

Thus, the example method depicted in FIGS. 3A1-3I3 may be used to form a monolithic three-dimensional semiconductor device, such as device 200 of FIGS. 2A-2E. Without wanting to be bound by any particular theory, it is believed that by staggering MRAM elements M1, M2, M3, . . . M16 vertically on second level 202b and third level 202c, such as described above, the effective pitch of MRAM elements M1, M2, M3, . . . M16 can be substantially matched to minimum pitch P1 of selector devices S1, S2, S3, . . . S16, respectively, thereby allowing selector devices S1, S2, S3, . . . S16 to be fabricated at a first minimum pitch P1 that is less than second minimum pitch P2 and third minimum pitch P3 of MRAM elements M1, M2, M3, . . . M16.

Referring now to FIGS. 4A1-4D3, another example method is described for forming a monolithic three-dimensional semiconductor device, such as device 200 of FIGS. 2A-2E. To avoid repeating portions of the description above, this method repeats the steps that result in the structures shown in FIGS. 3A1-3C3 up to forming second element M2, M4, M5, M7, M10, M12, M13, M15 (but without depositing second dielectric material 210). After forming second elements M2, M4, M5, M7, M10, M12, M13, M15, first sidewall spacers 402a are formed on sidewalls of second element M2, M4, M5, M7, M10, M12, M13, M15. For example, first sidewall spacers 402a are formed by depositing a silicon oxide layer or film over and between second elements M2, M4, M5, M7, M10, M12, M13, M15, followed by anisotropic etching of the silicon oxide layer or film.

First sidewall spacers 402a fill spaces around second elements M2, M4, M5, M7, M10, M12, M13, M15, leaving discrete spaces or first interstices 404a between adjacent first sidewall spacers 402a. Due to the annular shape of first sidewall spacers 402a, first interstices 404a have a rectangular cross sectional shape with concave sidewalls. First interstices 404a are disposed above every other first element S1, S2, S3, . . . S16. In an embodiment, first interstices 404a are disposed above and aligned with first elements S1, S3, S6, S8, S9, S11, S14, S16, resulting in the structure shown in FIGS. 4A1-4A3.

After first interstices 404a have been formed, a first conductive material is formed over substrate 204 to fill first interstices 404a to form first vias V1, V3, V6, V8, V9, V11, V14, V16. For example, approximately 10 nm and about 200 nm of titanium nitride may be deposited on the substrate 204 and planarized using chemical mechanical polishing or an etchback process to form a planar surface 406, completing second level 202b, and resulting in the structure shown in FIGS. 4B1-4B3. Other conductive materials and/or other conductive material layer thicknesses may be used. In an embodiment, first vias V1, V3, V6, V8, V9, V11, V14, V16 are disposed above and aligned with first elements S1, S3, S6, S8, S9, S11, S14, S16, respectively.

Following planarization, a second material layer 304b is deposited over substrate 204, and is patterned and etched to form third elements M1, M3, M6, M9, M9, M11, M14, M16, vertically disposed above and aligned with first vias V1, V3, V6, V9, V9, V11, V14, V16, respectively. After forming third elements M1, M3, M6, M9, M9, M11, M14, M16, second sidewall spacers 402b are formed on sidewalls of third elements M1, M3, M6, M9, M9, M11, M14, M16. For example, second sidewall spacers 402b are formed by depositing a silicon oxide layer or film over and between third elements M1, M3, M6, M9, M9, M11, M14, M16, followed by anisotropic etching of the silicon oxide layer or film.

Second sidewall spacers 402b fill spaces around third elements M1, M3, M6, M9, M9, M11, M14, M16, leaving discrete spaces or second interstices 404b between adjacent second sidewall spacers 402b. Due to the annular shape of second sidewall spacers 402b, second interstices 404b have a rectangular cross sectional shape with concave sidewalls. Second interstices 404b are disposed above a remaining every other first element S1, S2, S3, . . . S16. In an embodiment, second interstices 404b are disposed above and aligned with first elements S2, S4, S5, S7, S10, S12, S13, S15, resulting in the structure shown in FIGS. 4C1-4C3.

After second interstices 404b have been formed, a second conductive material is formed over substrate 204 to fill second interstices 404b to form second vias V2, V4, V5, V7, V10, V12, V13, V15. For example, approximately 10 nm and about 200 nm of titanium nitride may be deposited on the substrate 204 and planarized using chemical mechanical polishing or an etchback process to form a planar surface 408, completing third level 202c, and resulting in the structure shown in FIGS. 4D1-4D3. Other conductive materials and/or other conductive material layer thicknesses may be used. In an embodiment, second vias V2, V4, V5, V7, V10, V12, V13, V15 are disposed above and aligned with second elements M2, M4, M5, M7, M10, M12, M13, M15, respectively, which are disposed above and aligned with first elements S2, S4, S5, S7, S10, S12, S13, S15, respectively.

Thus, the example method depicted in FIGS. 4A1-4D3 may be used to form a monolithic three-dimensional semiconductor device, such as device 200 of FIGS. 2A-2E. The techniques illustrated in FIGS. 4A1-4D3 can be extended to four layers of pitch-limited structures. Such a technique may be used, for example, if first pitch P1 is less than $\sqrt{2}$ times the minimum pitch of the larger-pitch elements. In this method, the pitch of the larger-pitch elements can be relaxed to 2×P1.

Thus, as described above, one embodiment includes a method that includes forming a first level above a substrate, forming a second level above the first level, and forming a third level above the second level. The first level includes a plurality of first elements having a first minimum pitch, the second level includes a plurality of second elements having a second minimum pitch greater than the first minimum pitch, and the third level includes a plurality of third elements having a third minimum pitch greater than the first minimum pitch. The second elements are disposed above and aligned with a first plurality of the first elements, and the third elements are disposed above and aligned with a second plurality of the first elements.

One embodiment includes a device that includes a first level above a substrate, a second level above the first level, and a third level above the second level. The first level includes a plurality of first elements having a first minimum pitch, the second level includes a plurality of second elements having a second minimum pitch greater than the first minimum pitch, and the third level includes a plurality of third elements having a third minimum pitch greater than the first minimum pitch. The second elements and the third elements are disposed above and aligned with corresponding ones of the first elements.

One embodiment includes a method of forming a MRAM element array, the method including forming a plurality of selector elements having a first minimum pitch in a first level above a substrate, forming a plurality of MRAM elements above the plurality of selector elements, the MRAM elements having a second minimum pitch greater than the first minimum pitch, and vertically staggering the plurality of MRAM elements in a plurality of levels above the first level so that the plurality of MRAM elements has an effective minimum pitch that substantially matches the first minimum pitch.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application, to thereby enable others skilled in the art to best utilize the technology in various embodiments and with various modifications as are suited to the particular use contemplated. The scope of the technology is defined by the claims appended hereto.

The invention claimed is:

1. A method comprising:
   forming a first level above a substrate, the first level comprising a plurality of first elements having a first minimum pitch;
   forming a second level above the first level, the second level comprising a plurality of second elements having a second minimum pitch greater than the first minimum pitch; and
   forming a third level above the second level, the third level comprising a plurality of third elements having a third minimum pitch greater than the first minimum pitch,
   wherein the second elements are disposed above and aligned with a first plurality of the first elements, and the third elements are disposed above and aligned with a second plurality of the first elements, and
   wherein the first elements comprise selector devices, and the second elements and the third elements each comprise memory cells.

2. The method of claim 1, wherein:
   forming the first level comprises forming the first elements in a first direction and a second direction;
   the first plurality of first elements comprises every other first element in the first and second directions; and
   the second plurality of first elements comprises a remaining every other first element in the first and second directions.

3. The method of claim 1, further comprising:
   forming a plurality of first vias on the second level, each first via disposed between a corresponding one of the second plurality of first elements and a corresponding one of the third elements; and
   forming a plurality of second vias on the third level, each second via disposed on a corresponding one of the second elements.

4. The method of claim 1, wherein the second minimum pitch equals the third minimum pitch.

5. The method of claim 1, wherein the second minimum pitch equals a multiple times the first minimum pitch, and the third minimum pitch equals the multiple times the first minimum pitch.

6. The method of claim 1, wherein the first elements comprise vertical pillar-shaped selector devices, and the second elements and the third elements each comprise vertical pillar-shaped memory cells.

7. A device comprising:
   a first level above a substrate, the first level comprising a plurality of first elements having a first minimum pitch;
   a second level above the first level, the second level comprising a plurality of second elements having a second minimum pitch greater than the first minimum pitch; and
   a third level above the second level, the third level comprising a plurality of third elements having a third minimum pitch greater than the first minimum pitch,
   wherein the second elements and the third elements are disposed above and aligned with corresponding ones of the first elements, and wherein the first elements comprise selector devices, and the second elements and the third elements each comprise memory cells.

8. The device of claim 7, wherein:
the first level comprises first elements arranged in a first direction and a second direction;
the second elements are disposed above and aligned with every other first element in the first and second directions; and
the third elements are disposed above and aligned with a remaining every other first element in the first and second directions.

9. The device of claim 7, further comprising:
a plurality of first vias on the second level, each first via disposed between a corresponding one of the second plurality of first elements and a corresponding one of the third elements; and
a plurality of second vias on the third level, each second via disposed on a corresponding one of the second elements.

10. The device of claim 7, wherein the second minimum pitch equals the third minimum pitch.

11. The device of claim 7, wherein the second minimum pitch equals a multiple times the first minimum pitch, and the third minimum pitch equals the multiple times the first minimum pitch.

12. The device of claim 7, wherein the first elements comprise vertical pillar-shaped selector devices, and the second elements and the third elements each comprise vertical pillar-shaped memory cells.

13. A method for forming a magnetoresistive random access memory (MRAM) element array, the method comprising:
forming a plurality of selector elements having a first minimum pitch in a first level above a substrate;
forming a plurality of MRAM elements above the plurality of selector elements, the MRAM elements having a second minimum pitch greater than the first minimum pitch; and
vertically staggering the plurality of MRAM elements in a plurality of levels above the first level so that the plurality of MRAM elements has an effective pitch that substantially matches the first minimum pitch.

14. The method of claim 13, wherein vertically staggering comprises disposing a first plurality of MRAM elements at the second minimum pitch in a second level above the first level, and disposing a second plurality of MRAM elements at the second minimum pitch in a third level above the second level.

15. The method of claim 13, wherein vertically staggering comprises disposing a first plurality MRAM elements in a second level above the first level, with each of the first plurality of MRAM elements disposed above and aligned with every other selector element, and disposing a second plurality MRAM elements in a third level above the second level, with each of the second plurality of MRAM elements disposed above and aligned with a remaining every other selector element.

16. The method of claim 13, further comprising forming a plurality of first vias coupled between a first plurality of the selector elements and a first plurality of the MRAM elements, and forming a plurality of second vias coupled to a second plurality of the MRAM elements.

17. The method of claim 13, wherein the second minimum pitch equals a multiple times the first minimum pitch.

18. The method of claim 13, wherein the selector elements comprise vertical pillar-shaped selector devices, and the MRAM elements comprise vertical pillar-shaped memory cells.

* * * * *